United States Patent [19]
Matick et al.

[11] Patent Number: 5,388,072
[45] Date of Patent: Feb. 7, 1995

[54] BIT LINE SWITCH ARRAY FOR ELECTRONIC COMPUTER MEMORY

[75] Inventors: Richard E. Matick, Cortland; Stanley E. Schuster, Granite Springs, both of N.Y.

[73] Assignee: International Business Machines Corporation, Armonk, N.Y.

[21] Appl. No.: 866,934

[22] Filed: Apr. 10, 1992

[51] Int. Cl.$^6$ .......................... G11C 8/00; G11C 7/00
[52] U.S. Cl. .......................... 365/230.03; 365/189.01; 365/207
[58] Field of Search ............ 365/230.03, 230.04, 365/231, 238.5, 207, 189.01

[56] References Cited

U.S. PATENT DOCUMENTS

| | | | |
|---|---|---|---|
| 4,150,441 | 4/1979 | Ando | 365/189 |
| 4,393,472 | 7/1983 | Shimada et al. | 365/230.03 |
| 4,675,808 | 6/1987 | Grinn et al. | 365/230.04 |
| 4,692,900 | 9/1987 | Ooami et al. | 365/230.03 |
| 4,724,518 | 2/1988 | Steps | 395/425 |
| 4,758,991 | 7/1988 | Ichida | 365/195 |
| 4,794,559 | 12/1988 | Greenberger | 365/49 |
| 4,796,227 | 1/1989 | Lyon et al. | 365/154 |
| 4,905,188 | 2/1990 | Chuang et al. | 364/900 |
| 4,954,987 | 9/1990 | Auvinen | 365/230.04 X |
| 4,991,142 | 2/1991 | Wang | 365/208 |
| 5,058,068 | 10/1991 | Costabello | 365/230.03 |
| 5,109,361 | 4/1992 | Yim et al. | 365/230.03 |

FOREIGN PATENT DOCUMENTS 0409449  1/1991  European Pat. Off. ........ 365/189.02

OTHER PUBLICATIONS

Chappell, T. I., et al. "A 2-ns Cycle, 3.8-ns Access 512-kb CMOS ECL SRAM with a Fully Pipelined Architecture." IEEE Journal of Solid-State Circuits, vol. 26, No. 11, Nov. 1991, pp. 1577-1585.

Cocke, J., et al. "The IBM RISC System/6000 Processor." IBM Journal of Research and Development, vol. 34, No. 1, Jan. 1990.

Matick, R. E., et al. "Architectural Implications in the Design of Microprocessors." IBM Systems Journal, vol. 23, No. 3, 1984, pp. 264-280.

Matick, R. E., et al. "Architecture, design, and operating characteristics of a 12-ns CMOS functional cache chip." IBM Journal of Research and Development, vol. 33, No. 5, Sep. 1989, pp. 524-539.

Matick, R. E., et al. "Electronic Computer Memory System Having Multiple Width, High Speed Communication Buffer." U.S. Patent Application Ser. No. 826,306 filed on Jan. 24, 1992.

Matick, R. E., et al. "Functional Cache for Improved System Performance." IBM Journal of Research and Development, vol. 33, No. 1, Jan. 1989, pp. 15-32.

Radin, G., "The 801 Minicomputer." IBM Journal of Research and Development, vol. 27, No. 3, 1983, pp. 237-246.

Primary Examiner—Eugene R. LaRoche
Assistant Examiner—Son Dinh
Attorney, Agent, or Firm—Marc D. Schechter; Robert P. Tassinari, Jr.

[57] ABSTRACT

A cache memory having rows of memory cells, each row having at least first and second blocks of memory cells. Each memory cell stores a data signal, has at least one word line input, and at least one bit line input/output. A word line connects the word line inputs of at least first, second, third, and fourth memory cells in a row of the cache memory. The first and third memory cells are contained in the first block, while the second and fourth memory cells are contained in the second block. First and second sense amplifiers or write drivers are provided for reading data from or writing data to memory cells. First and second switches having control inputs connect the bit line inputs/outputs of the first and second memory cells, respectively, to the first sense amplifier/write driver. Third and fourth switches having control inputs switchably connect the bit line inputs/outputs of the third and fourth memory cells, respectively, to the second sense amplifier/write driver. The control inputs of the first, second, third, and fourth switches are capable of being independently actuated. Selection means, such as an address decoder, independently actuate either the first and third switches to connect memory cells only in the first block to the sense amplifiers, or the first and fourth switches to connect memory cells in both the first and second blocks to the sense amplifiers.

7 Claims, 22 Drawing Sheets

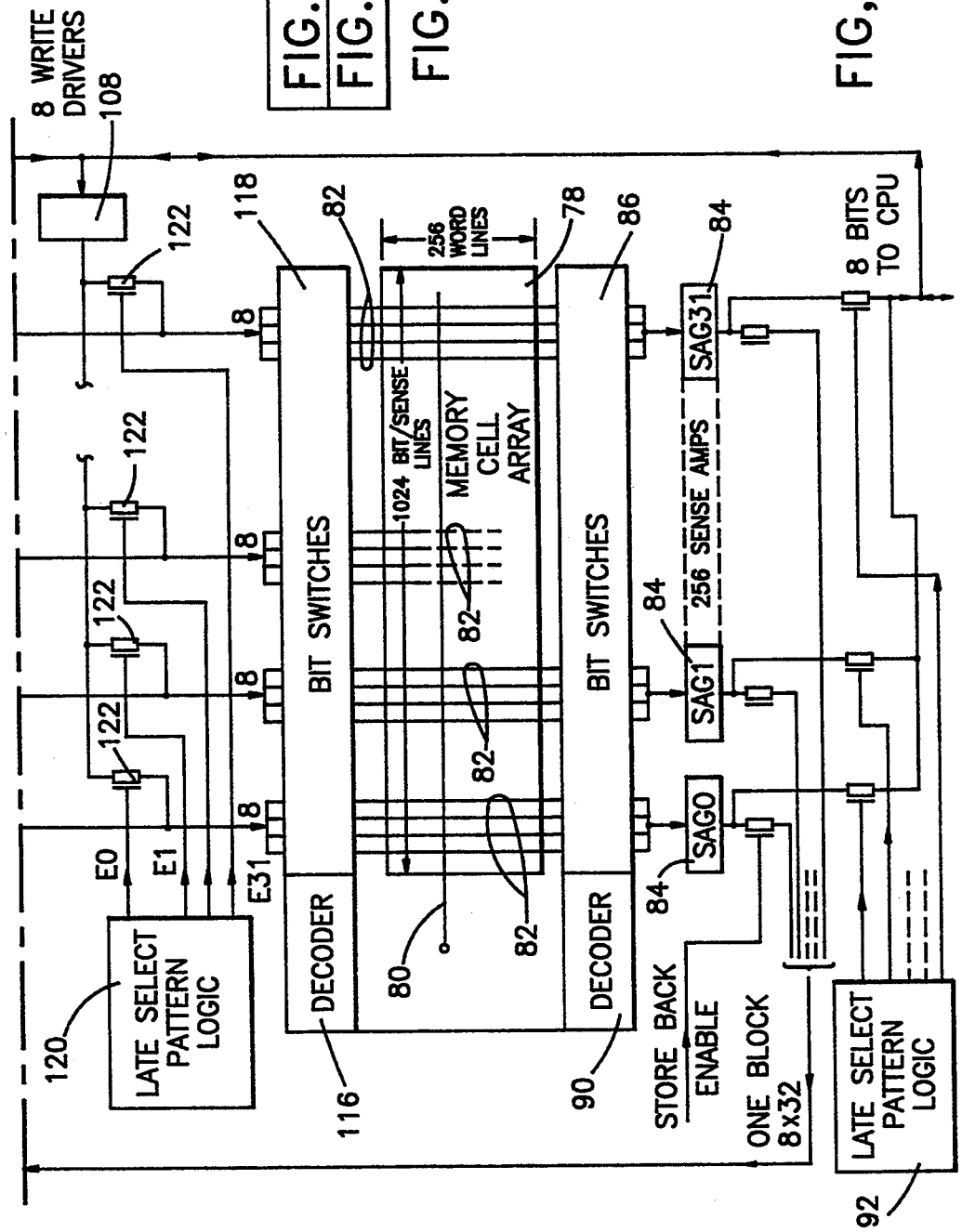

INDEX ON EACH BLOCK
IS NUMBER OF THE
LOGICAL WORD

|       |       |       |       |     |
|-------|-------|-------|-------|-----|
| $A_0$ | $B_0$ | $C_0$ | $D_0$ | RC0 |
| $D_1$ | $A_1$ | $B_1$ | $C_1$ | RC1 |
| $C_2$ | $D_2$ | $A_2$ | $B_2$ | RC2 |
| $B_3$ | $C_3$ | $D_3$ | $A_3$ | RC3 |

LCC− I   II   III   IV

ROW CONGRUENCE CLASS

LATIN SQUARE COLUMN
CONGRUENCE CLASS

FIG.8

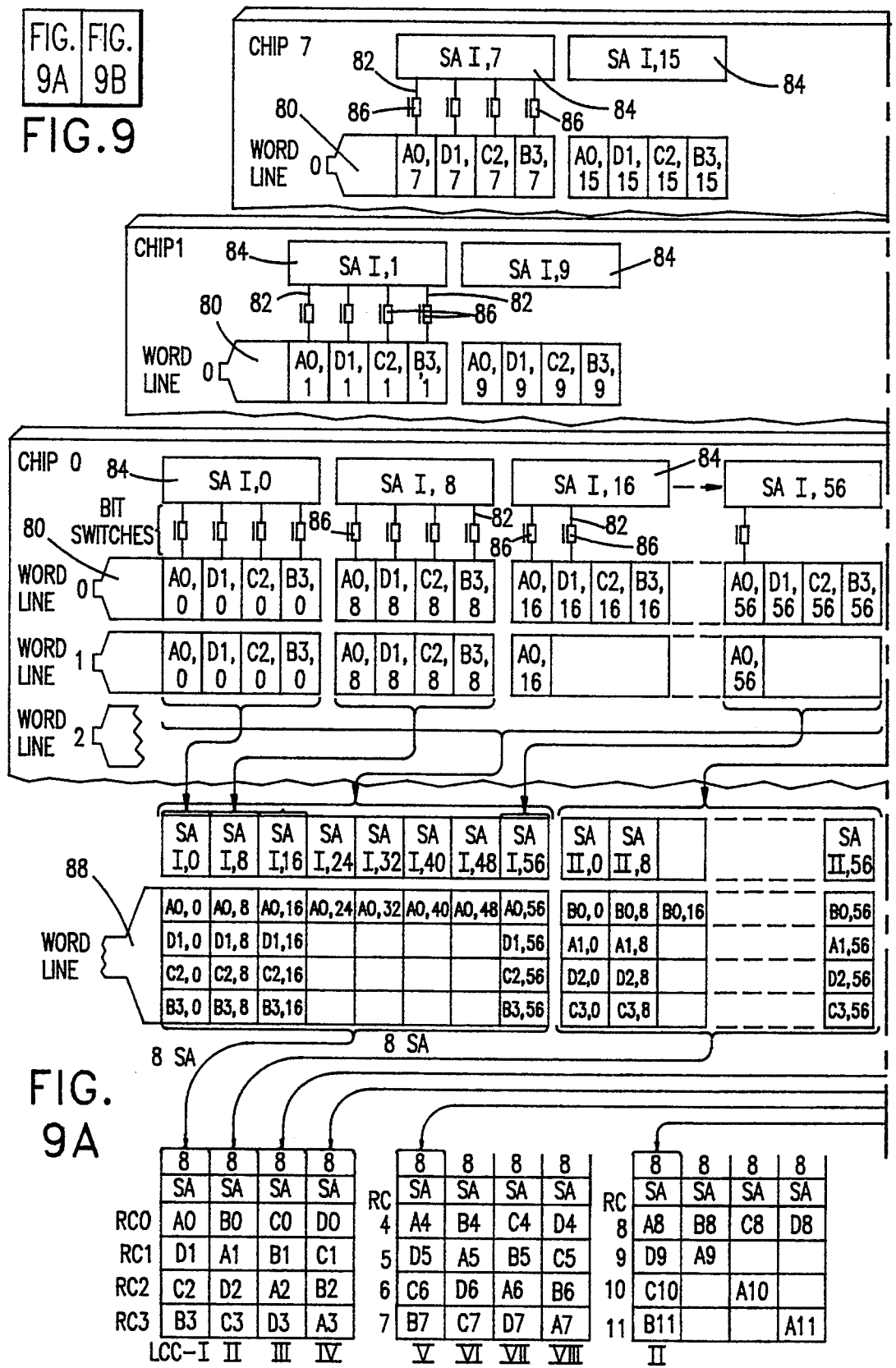

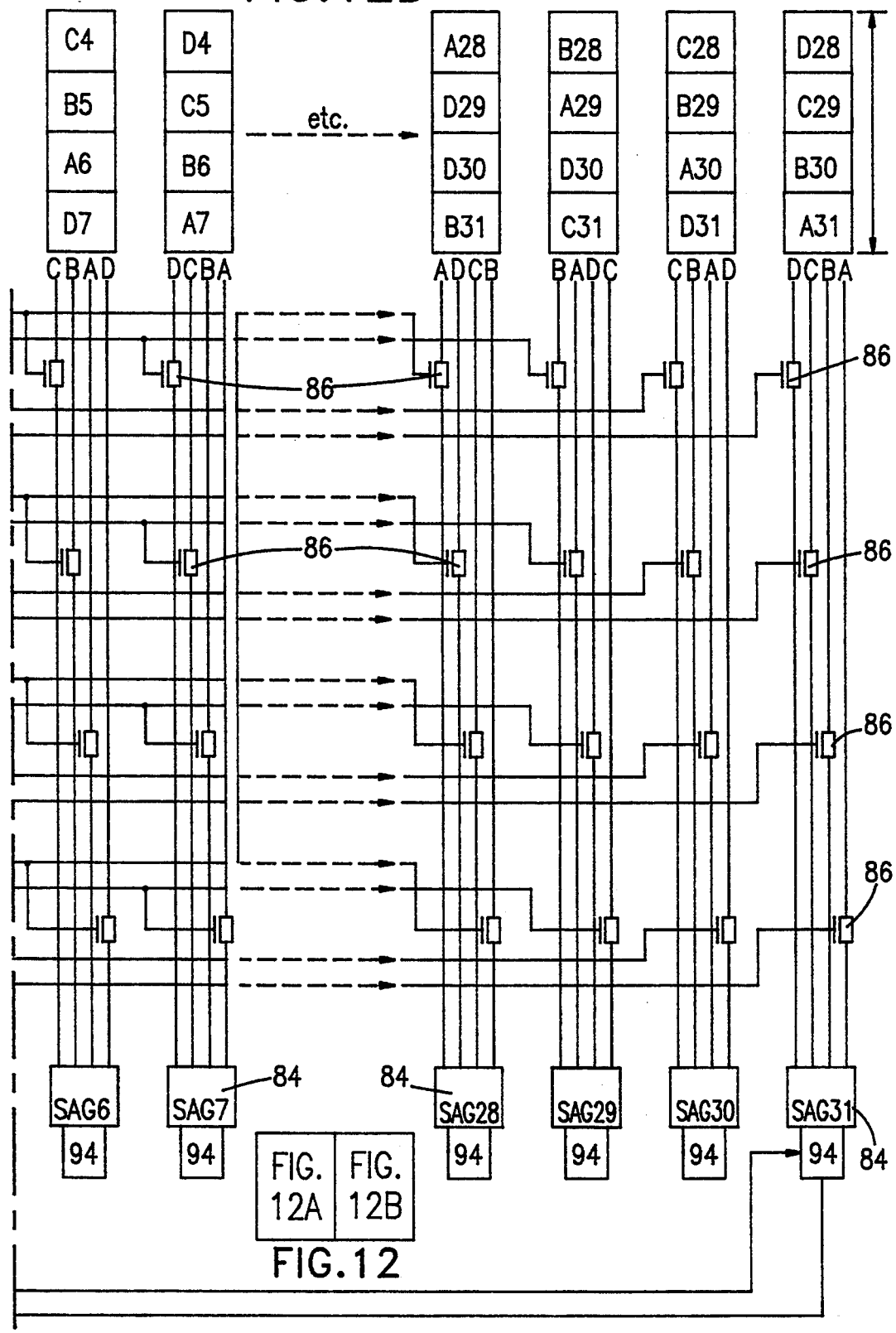

| FIG. 15A |
| FIG. 15B |

FIG. 16

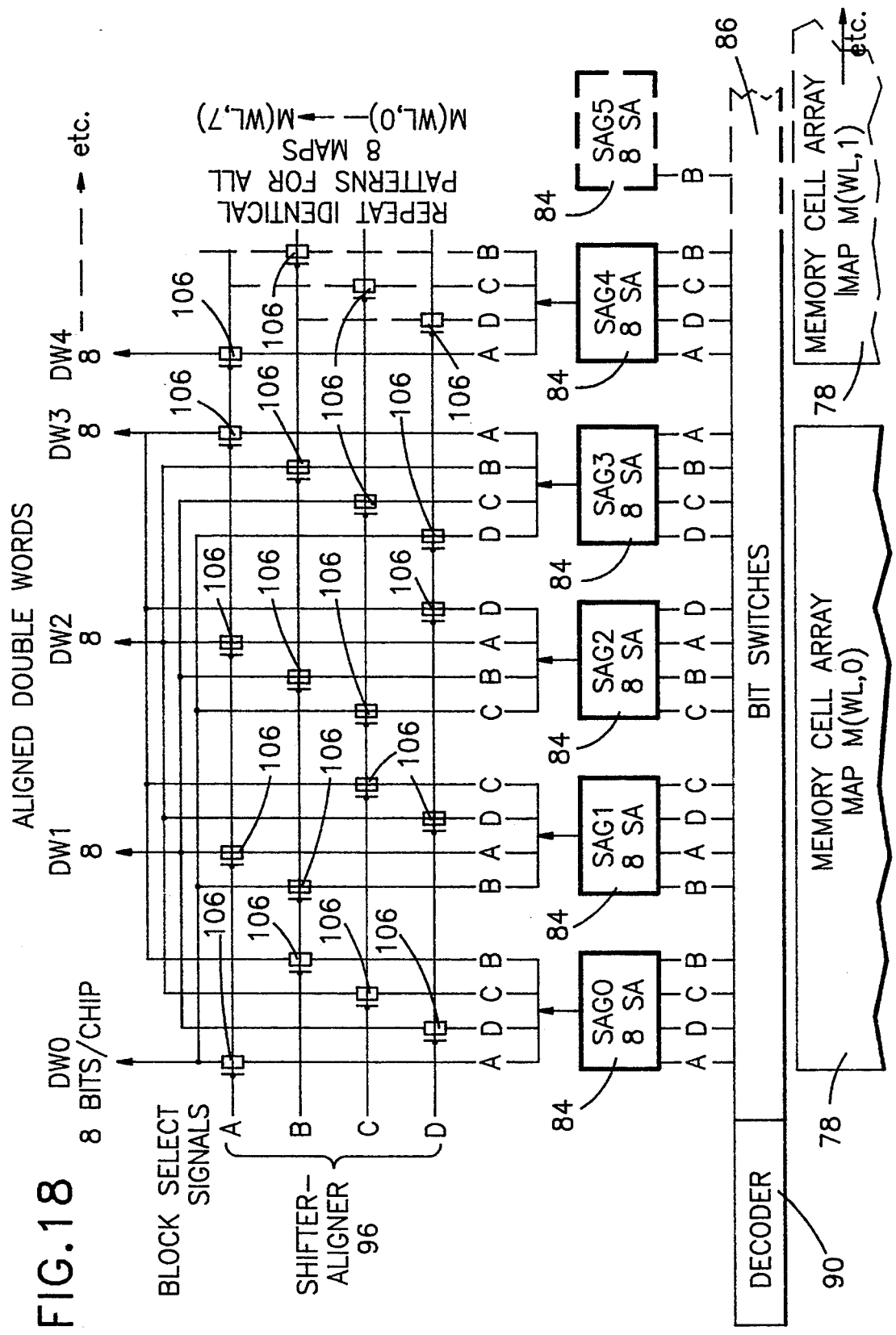

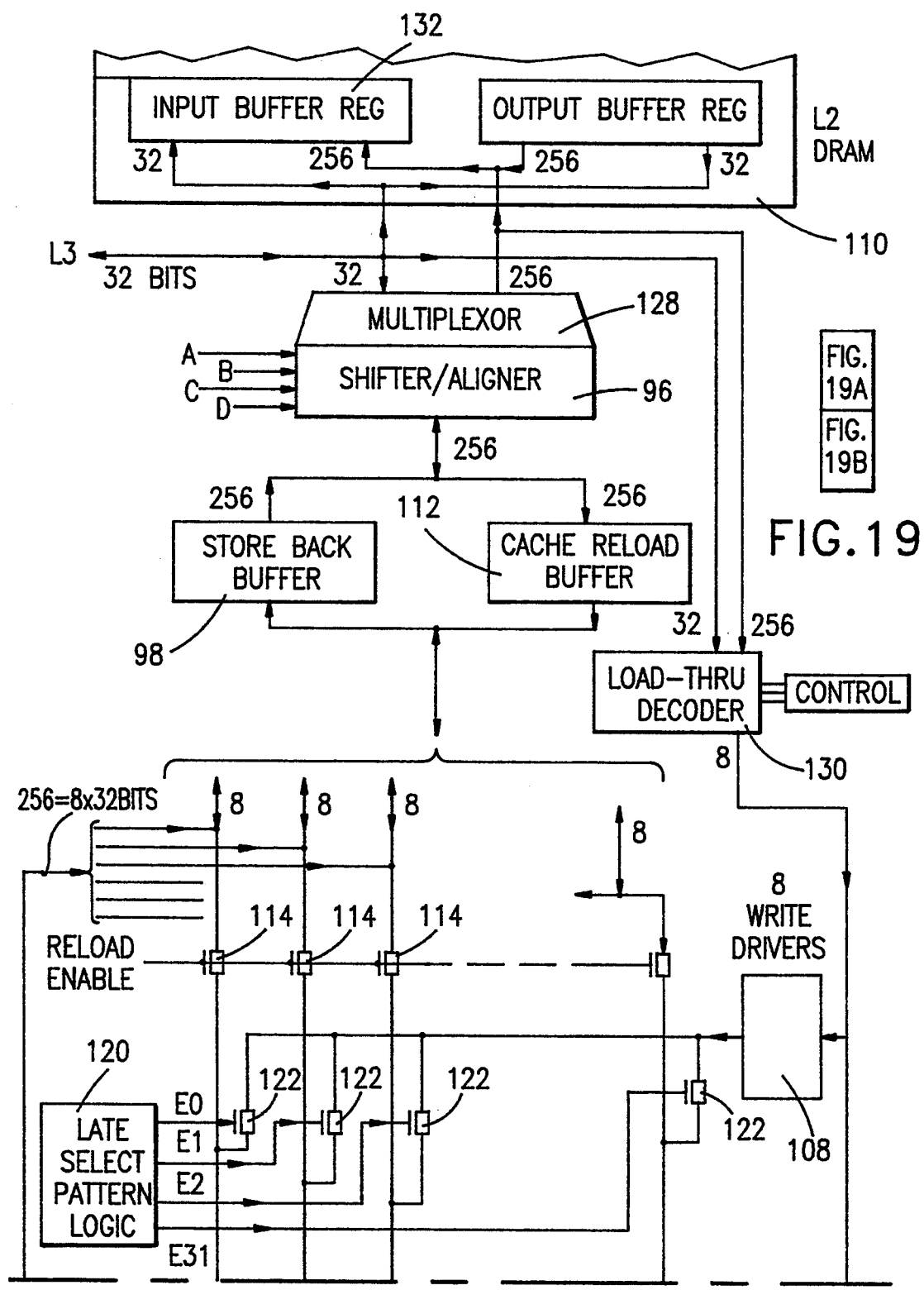

BIT LINE SWITCH ARRAY FOR ELECTRONIC COMPUTER MEMORY

BACKGROUND OF THE INVENTION

The invention relates to electronic computer memories. Electronic computer memories store data and instructions for use by a central processing unit. For good performance, an electronic computer memory should have a large size, high speed, and low cost.

In order to obtain good performance, it is known to organize electronic computer memories in a memory hierarchy of multiple memory levels. For example, the first memory level (L1) which communicates directly with the central processing unit may comprise a small, high-speed electronic computer memory having a high cost per memory cell. A second memory level (L2), which communicates with the first memory level, but which does not communicate directly with the central processing unit, may comprise a larger, but slower electronic computer memory having a lower cost per memory cell. If desired, a third memory level (L3), which communicates with the second memory level, which optionally communicates with the first memory level, but which does not communicate directly with the central processing unit, may comprise an even larger, but even slower electronic computer memory having an even lower cost per memory cell. Further memory levels may be provided if desired.

The first memory level is generally a set associative cache memory. To obtain high speed, the cache memory contains large sense amplifiers and write drivers which may extend across two or more columns of memory cells (that is, which may extend across two or more bit/sense lines). In a set associative cache memory, access by the central processing unit involves accessing a set of memory cells containing portions of two or more cache blocks, only one of which contains the desired data or instruction. Access from the first memory level to a higher memory level involves accessing an entire single cache block which contains the desired data or instruction.

Designing a set associative cache memory for fast central processing unit access may reduce the access speed to higher memory levels, or may require additional and more costly circuitry to avoid reducing the speed of accessing higher memory levels.

SUMMARY OF THE INVENTION

It is an object of the invention to provide an electronic computer memory in which access to the central processing unit and access to higher memory levels can be achieved at high speed.

It is a further object of the invention to provide an electronic computer memory in which access to the central processing unit and access to higher memory levels can be achieved at high speed, and can be achieved with a compact, low cost circuit design.

According to the invention, an electronic computer memory comprises an array of memory cells. Each memory cell stores a data signal, and each memory cell has at least one word line input and at least one bit line output. At least one word line is connected to the word line inputs of at least first, second, third, and fourth memory cells. First and second sense amplifiers are provided for reading data from memory cells.

First, second, third, and fourth switches, each having a control input, are also provided. The first switch switchably connects the bit line output of the first memory cell to the first sense amplifier. The second switch switchably connects the bit line output of the second memory cell to the first sense amplifier.

The third switch switchably connects the bit line output of the third memory cell to the second sense amplifier. The fourth switch switchably connects the bit line output of the fourth memory cell to the second sense amplifier. The control inputs of the first, second, third, and fourth switches are capable of being independently actuated.

In another aspect of the invention, the electronic computer memory comprises an array of memory cells each having at least one bit line input. First and second write drivers are provided for writing data to memory cells. A first switch switchably connects the bit line input of the first memory cell to the first write driver. A second switch switchably connects the bit line input of the second memory cell to the first write driver. A third switch switchably connects the bit line input of the third memory cell to the second write driver, and a fourth switch switchably connects the bit line input of the fourth memory cell to the second write driver. The control inputs of the first, second, third, and fourth switches are capable of being independently actuated.

The electronic computer memory may further comprise address decoding means for independently actuating either the first and third switches or the first and fourth switches.

Each memory cell may, for example, have two bit line inputs and/or two bit line outputs.

In another aspect of the invention, an electronic computer memory comprises a cache memory comprising a plurality of rows of memory cells. Each row of memory cells comprises at least first and second blocks of memory cells. Each memory cell stores a data signal, and each memory cell has at least one word line input and at least one bit line output. A word line is connected to the word line inputs of at least first, second, third, and fourth memory cells in a row of the cache memory. The first and third memory cells are contained in the first block, and the second and fourth memory cells are contained in the second block. First and second sense amplifiers are provided for reading data from memory cells.

First, second, third, and fourth switches, each having a control input, are provided. The first switch switchably connects the bit line output of the first memory cell to the first sense amplifier. The second switch switchably connects the bit line output of the second memory cell to the first sense amplifier. The third switch switchably connects the bit line output of the third memory cell to the second sense amplifier, and the fourth switch switchably connects the bit line output of the fourth memory cell to the second sense amplifier. The control inputs of the first, second, third, and fourth switches are capable of being independently actuated.

The electronic computer memory may further comprise selection means for independently actuating either the first and third switches to connect memory cells only in the first cache block to the sense amplifiers, or the first and fourth switches to connect memory cells in both the first and second cache blocks to the sense amplifiers.

The selection means may further independently actuate either the second and fourth switches to connect memory cells only in the second block to the sense amplifiers, or the second and third switches to connect memory cells in both the first and second blocks to the sense amplifiers.

In another aspect of the invention, each row of memory cells comprises M blocks of memory cells. (Typically, a cache "block" or cache "line" is the unit of cache memory replaced from a higher memory level when there is a cache access miss.) Each block of memory cells comprises N memory cells. The computer memory comprises N sense amplifiers for reading data from memory cells. The computer memory also comprises M times N switches. Each switch switchably connects the bit line output of only one memory cell per row to one sense amplifier. Each switch has a control input. The control inputs of the switches are capable of being independently actuated. The selection means independently actuate a first group of switches to connect N memory cells in a block to the sense amplifiers, or independently actuate a second group of switches to connect N divided by M memory cells in each of the M blocks to the sense amplifiers.

In the electronic computer memory according to the present invention, by connecting the memory cells to the sense amplifiers (or to the write drivers) by way of switches which are capable of being independently actuated, access to the central processing unit and access to higher memory levels can be achieved at high speed with a compact and low cost circuit design.

BRIEF DESCRIPTION OF THE DRAWING

FIG. 8 schematically shows an example of a portion of a Latin square mapped memory cell array.

FIG. 16 schematically shows an example of data alignment in a Latin square mapped memory cell array.

FIG. 18 schematically shows an example of a data shifter/aligner for implementing the realignment shown in FIG. 17.

DESCRIPTION OF THE PREFERRED EMBODIMENTS

Figure 1:
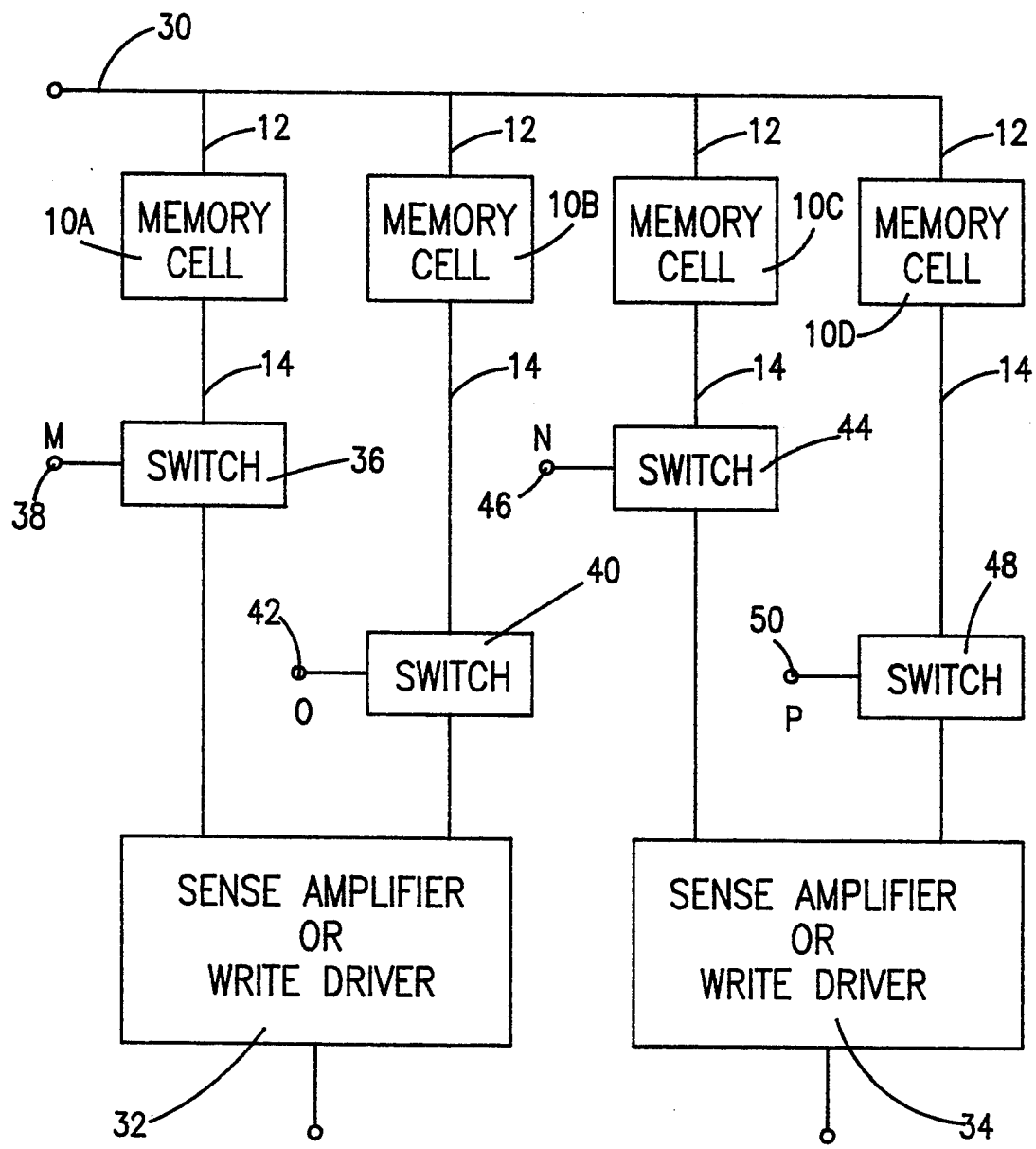
FIG. 1 is a block diagram of an example of an electronic computer memory according to the invention.

FIG. 1 is a block diagram of an example of an electronic computer memory according to the present invention. The electronic computer memory comprises an array of memory cells 10A, 10B, 10C, and 10D. Each memory cell 10 stores a data signal. Each memory cell has at least one word line input 12 and at least one bit line output and/or bit line input 14.

Figure 2:
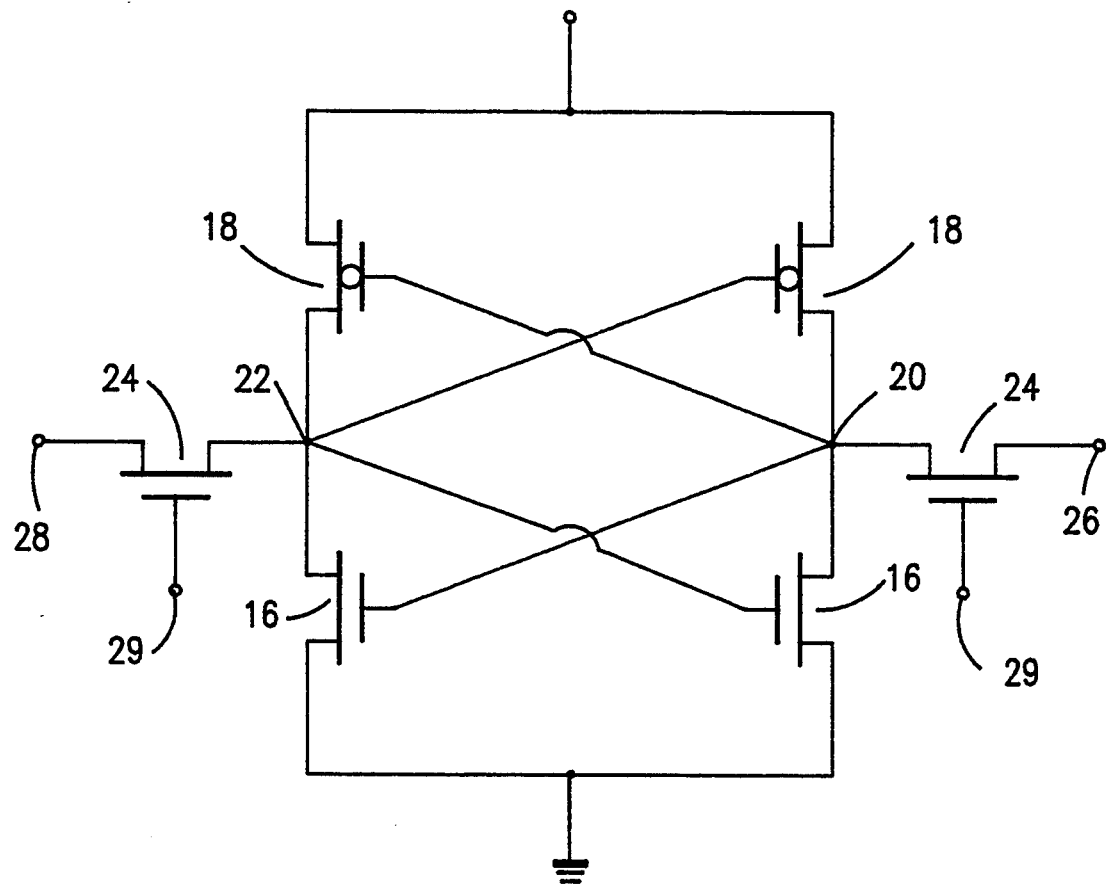
FIG. 2 schematically shows an example of a memory cell.

FIG. 2 schematically shows an example of a memory cell 10 comprising six field effect transistors. Field effect transistors 16 may be, for example, N-channel, while field effect transistors 18 may be P-channel. The memory cell stores a data signal in the form of a first state having a high voltage at node 20 and having a low voltage at node 22, or a second state having a high voltage at node 22, and a low voltage at node 20. Switching field effect transistors 24 connect nodes 20 and 22 to bit line inputs/outputs 26 and 28, respectively, when a suitable signal is applied to word line inputs 29.

Returning to FIG. 1, at least one word line 30 is connected to the word line inputs 12 of at least first, second, third, and fourth memory cells 10A, 10B, 10C, and 10D. A first sense amplifier or write driver 32 is provided for reading data from or for writing data to memory cells. A second sense amplifier or write driver 34 is provided for reading data from or writing data to memory cells.

A first switch 36 is provided for switchably connecting the bit line output/input 14 of the first memory cell 10A to the first sense amplifier or write driver 32. The first switch 36 has a control input 38. A second switch 40 is provided for switchably connecting the bit line output/input 14 of the second memory cell 10B to the first sense amplifier or write driver 32. The second switch 40 has a control input 42. A third switch 44 is provided for switchably connecting the bit line output/input 14 of the third memory cell 10C to the second sense amplifier or write driver 34. The third switch 44 has a control input 46. A fourth switch 48 is provided for switchably connecting the bit line output/input 14 of the fourth memory cell 10D to the second sense amplifier or write driver 34. The fourth switch 48 has a control input 50. As shown in FIG. 1, the first, second, third, and fourth switches 36, 40, 44, and 48 are capable of being independently actuated.

Figure 3:
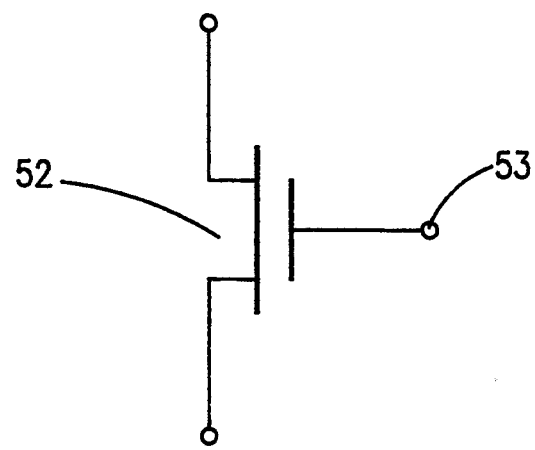
FIG. 3 schematically shows an example of a switch.

FIG. 3 schematically shows an example of a switch 36, 40, 44, or 48. In this example, the switch comprises a single field effect transistor 52 having a gate 53 forming a control input. Other suitable switches may alternatively be used.

Figure 4:
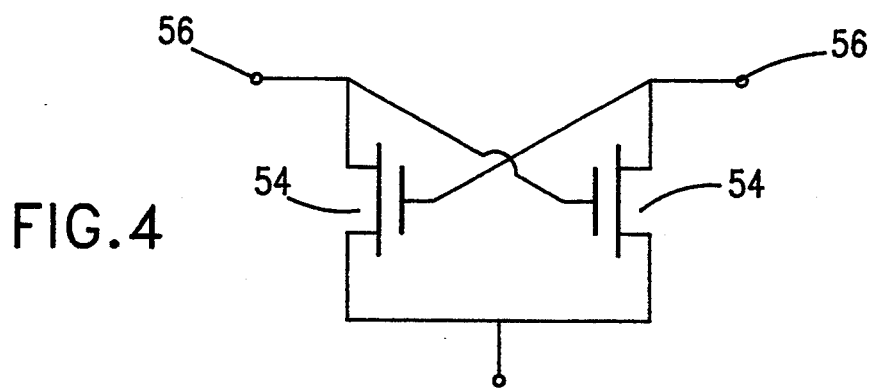
FIG. 4 schematically shows an example of a sense amplifier.

FIG. 4 schematically shows an example of sense amplifier 32 or 34. In this example, the sense amplifier comprises cross-coupled field effect transistors 54. Data signals are read into the sense amplifier, and amplifier data signals are read out of the sense amplifier at nodes 56.

Figure 5:
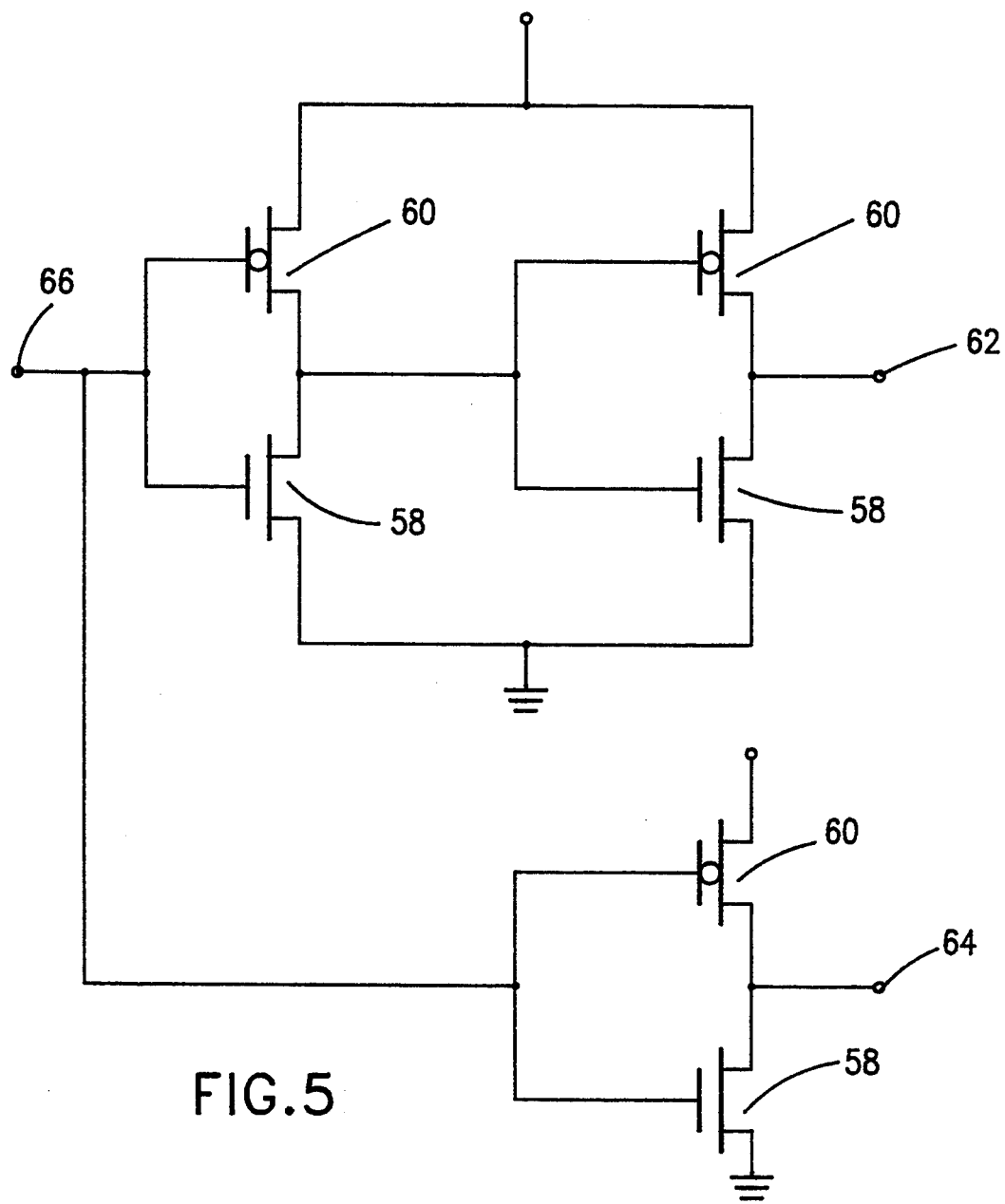
FIG. 5 schematically shows an example of a write driver.

FIG. 5 schematically shows an example of write driver 32 or 34. In this example, the write driver comprises N-channel field effect transistors 58, and P-channel field effect transistors 60. "True" and "Complement" outputs 62 and 64, respectively, provide signals representing the data at input 66 and the complement of the data at input 66, respectively.

Figure 6:
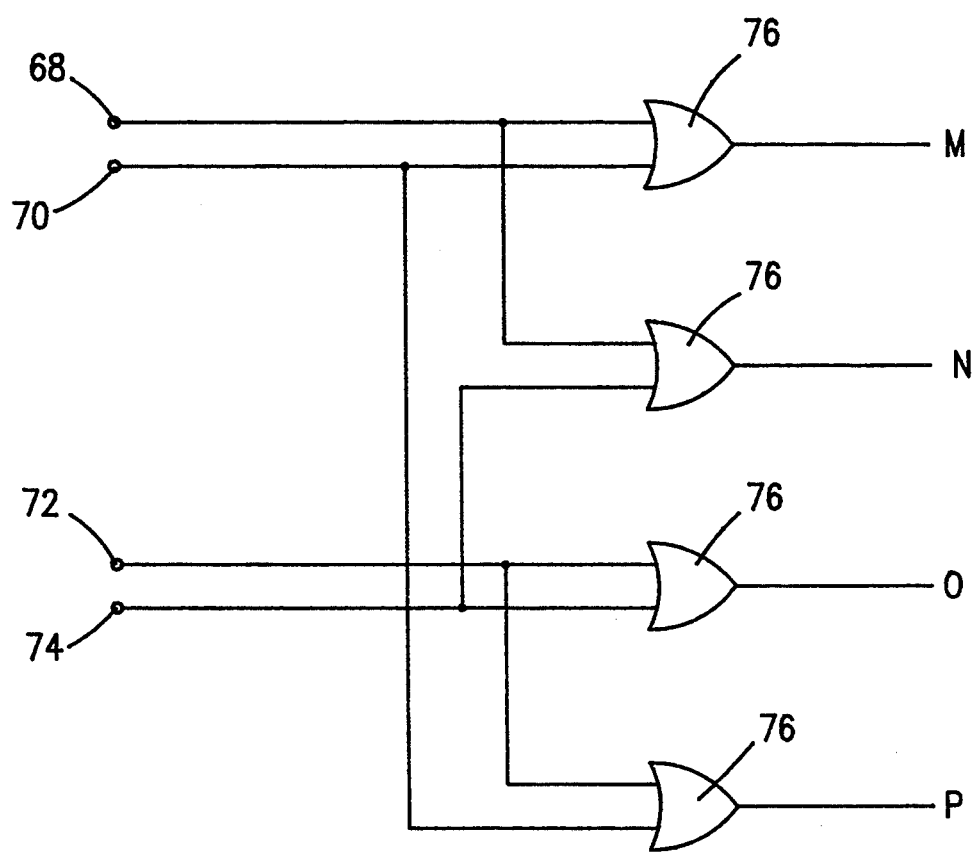
FIG. 6 schematically shows an example of an address decoder.

FIG. 6 schematically shows an example of an address decoder. In this example, the address decoder comprises inputs 68, 70, 72, and 74, OR gates 76, and outputs M, N, O, and P. The outputs M, N, O, and P are connected to the control inputs 38, 46, 42, and 50, respectively, of switches 36, 44, 40, and 48 of FIG. 1. By providing a signal at input 68 of the address decoder, the first and third switches 36 and 44 are actuated. By providing a signal at input 70 of the address decoder, the first and fourth switches 36 and 48 are actuated. Providing a signal at address decoder input 72 actuates the second and fourth switches 40 and 48, and providing a signal at address decoder input 74 actuates the second and third switches 40 and 44.

When the memory cells 10 of FIG. 1 form all or part of a row of a cache memory the first and third memory cells 10A and 10C may be contained in a first block of memory cells, and the second and fourth memory cells 10B and 10D may be contained in a second block of memory cells. (As mentioned previously, typically a cache "block" is the unit of cache memory replaced from a higher memory level when there is a cache access miss.) In this case, the address decoder of FIG. 6 forms a selection means for independently actuating either the first and third switches 36 and 44 to connect memory cells only in the first block to the sense amplifiers 32 and 34, or the first and fourth switches 36 and 48 to connect memory cells in both the first and second blocks to the sense amplifiers 32 and 34.

Figure 7A:
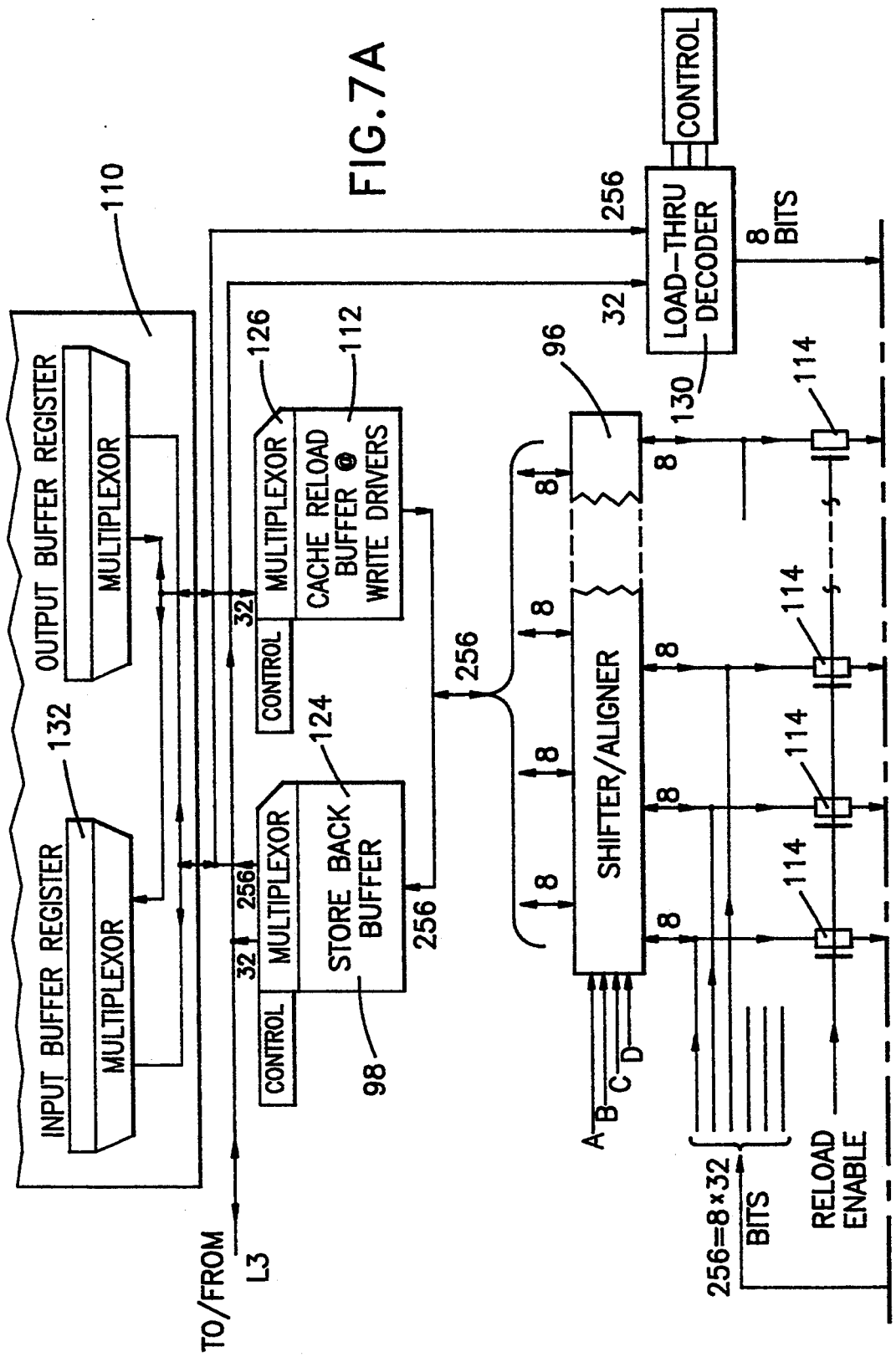
FIG. 7 is a block diagram of an example of an alternative electronic computer memory according to the invention.

FIG. 7 is a block diagram of an example of a preferred embodiment of an electronic computer memory according to the invention. In the preferred memory hierarchy the first memory level (L1) which is closest to and which is accessed by the central processing unit (CPU) comprises a static random access memory (SRAM) cache, organized as a late select, four-way set associative array. The second memory level (L2) comprises a dynamic random access memory (DRAM) which is one backup memory from which the first memory level is reloaded on a cache miss. In this example, the first memory level or the second memory level can be reloaded from a main memory which forms the third memory level (L3). The first and second memory levels are preferably integrated onto one chip, although they need not be. A typical memory consists of one or more such chips, depending on the capacity desired.

Such a memory hierarchy is described, for example, in U.S. patent application Ser. No. 826,306 filed on Jan. 24, 1992, entitled "Electronic Computer Memory System Having Multiple Width, High Speed Communication Buffer."

The preferred embodiment will be illustrated with a particular set of parameters for the sake of more clearly understanding the invention, and for the sake of showing the total capability of the invention.

Referring to FIG. 7, the first memory level consists of a 256,000 (256K) byte static random access memory cell array 78 obtained by the use of eight identical chips. Each chip contains a 256K bit static random access memory array which is one part of the full chip. The static random access memory may, for example, have features similar to those described in an article entitled "A 2-ns Cycle, 3.8-ns Access 512-kb CMOS ECL SRAM with a Fully Pipelined Architecture" by T. Chappell, B. Chappell, S. Schuster, J. Allan, S. Klepner, R. Joshi, and R. Franch (*IEEE Journal of Solid-State Circuits*, Volume 26, No. 11, Nov. 1991, pages 1577–1585, ISSCC91 *Digest of Technical Papers*, Feb. 13–15, 1991, San Francisco, pages 50–51).

The cache is organized as a four-way set associative, late select array, using cache blocks of 256 bytes each. Each cache block is a section of the cache in which a group of contiguous bytes (in this example, 256 contiguous bytes) of data from a higher level memory, such as main memory, is stored. The design is a store-in cache. A store-thru cache is a workable alternative, but is not typical in such systems, and is not the preferred embodiment. It is assumed that the desired logical word (LW) accessed by the central processing unit is a double word (DW) consisting of eight bytes formed by eight bits from each of the eight chips.

The static random access memory cell array 78 is organized as an array of 256 rows of 1024 memory cells per row. Each row of memory cells is provided with one word line 80, and each column of memory cells is provided with one bit/sense line (or with one bit/sense line "true"/"complement" pair). In FIG. 7, each line 82 represents eight bit/sense lines (or eight bit/sense line "true"/"complement" pairs). In order to obtain high speed and high density, very large, well integrated sense amplifiers are required which span several cells (bit/sense lines). Thus, the number of available sense amplifiers will be in the range of one-forth to one-eighth the number of memory cells per row. We will choose, for example, a design with 256 sense amplifiers per row of 1024 memory cells.

In order to achieve a four-way set associative, late select cache design which has the capability for fast reload, certain relations must exist between the set associativity, the block size, the logical word size, and the array organization. The mapping of the stored bits must then be done in a proper manner to achieve this design. For certain conditions, a very simple mapping and array organization is possible. These conditions are that if we wish to load and unload a full block of $B_{b1}$ bytes on $N_c$ chips in $\alpha$ cycles, in a cache having a set associativity of S, then the number of bits per row $b_r$ (bits on each physical word line) must satisfy $$b_r \geq \frac{8 S B_{b1}}{\alpha N_c} = \frac{S b_{b1}}{\alpha N_c} \qquad [1]$$

where $b_{b1} = 8 B_{b1}$, and the number of sense amplifiers available at either the top or bottom of the array, for sensing four double words from a congruence class or for sensing a a block for the reload path, must be equal to or greater than the minimum value of $b_r$ in Equation 1.

In our preferred embodiment, with $S=4$, $N_c=8$ chips, $B_{b1}=256$ bytes, and $\alpha=1$ cycle, the simple mapping would require $b_r \geq 1024$ bits per row, and a minimum of 1024 sense amplifiers. Our array has the minimum number of bits per row of 1024, but has only 256 sense amplifiers. Thus, the simple mapping is not possible. Consequently, a different and more complex type of mapping, called "Latin square" mapping, is needed to achieve the fast reload bandwidth with the set associative, late select design. (See, for example, Matick, R. E., et al. "Functional cache for improved system performance." *IBM Journal of Research and Development*, Vol. 33, No. 1, January 1989, pages 15-32.)

The following description makes extensive use of the Latin square mapping shown in FIG. 8. The indices 0, 1, 2, and 3 on the cache blocks A, B, C, and D represent the logical word boundary, which is a double word of eight bytes in this case.

Two types of congruence classes are defined, one for the rows and one for the columns. The normal congruence class designation used in typical set associative, late select cache design is the row congruence class, RC, consisting of the rows in FIG. 8. These are labeled RC0, RC1, RC2, and RC3 as shown. Each row congruence class contains one double word from each of the four cache blocks, each double word having the same double word index number. Thus, the first row contains the first double word DW0 from each of the four cache blocks on a row of the cache memory. The second row contains the second double word DW1 from each of the four cache blocks on a row of the cache memory. The third row contains the third double word DW2 from each of the four cache blocks on a row of the cache memory. The fourth row contains the fourth double word DW3 from each of the four cache blocks on a row of the cache memory.

A new type of congruence class, represented by each column of FIG. 8, also only contains one double word from each of the four cache blocks. However, in this case each double word has a different double word index number. This is called the Latin square column congruence class (LCC). For instance, in the map of FIG. 8, each Latin square column congruence class contains a logical word 0, 1, 2, and 3 from the four different cache blocks A, B, C, and D.

Since each double word from each cache block in a row of a Latin square map has the same index, by providing one access port for each column, a double word having the same index from each of the four cache blocks can be accessed by selecting columns I, II, III, and IV and a single row. This constitutes a normal central processing unit access for a late select cache design.

For reload, all ports should go to one cache block. This is possible with the Latin square map because each column contains only one double word from each cache block. For example, cache block A is reloaded by selecting column I on row 0, column II on row 1, column III on row 2, and column IV on row 3. In a similar manner, cache blocks B, C, or D can be selected by the proper combination of rows with columns. This ability to perform two different types of addressing, one for normal access and one for reload, is accomplished by special addressing decoders described below.

Figure 9B:
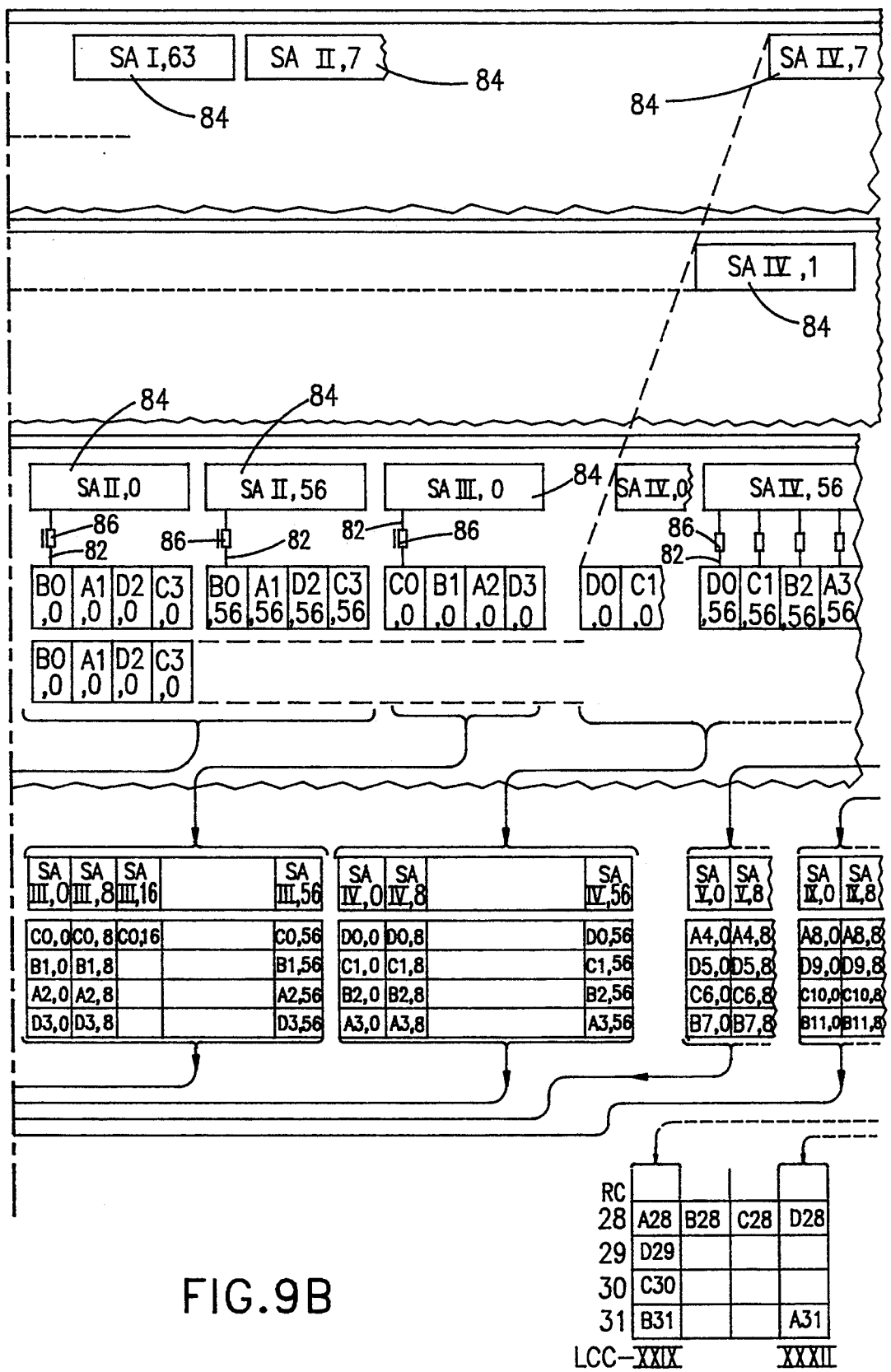
FIG. 9 schematically shows a more detailed example of a portion of a Latin square mapped memory cell array.

For the preferred embodiment, an interleaved Latin square type of mapping of memory cells is used, resulting in the memory cell array layout shown in FIG. 9. Each memory cell has a mapping of the form $X_{LW,BIT}$, where X is one of the blocks A, B, C, or D, where LW is the logical word index number from 0 to 32 (each logical word being a double word of eight bytes), and where BIT is the bit number 0 to 63 in the double word. Each sense amplifier 84 has a designation of the form SA LCC,BIT, where LCC is the associated Latin square column congruence class, and where BIT is the bit number 0 to 63 in the double words in the associated Latin square column congruence class.

The sense amplifier pitch is four, meaning each sense amplifier (SA) 84 serves four bit/sense lines 82, and requires decoding of one out of four bit/sense lines 82. This is done via the bit switches 86, in a manner described below. The sense amplifier pitch exactly matches the set associativity of four, and provides a method to interleave the Latin square mappings for minimizing the length of shift for data alignment, as will be seen. All eight chips have identical mappings except the bit positions are incremented by one on each successive chip as shown. Thus, the eight byte logical word is composed of eight adjacent bits along a row on eight chips. A byte is stored across eight chips.

In order to simplify the mapping diagrams and relate them to the Latin square ordering, the mapping will be presented as follows. Notice that the first four bits along any row (word line 80) in FIG. 9 are connected to the same sense amplifier and correspond to the first column in FIG. 8, namely LCC-I. Thus, these four bits are shown vertically along word line 88, even though they belong to a single word line. Further notice that the first eight sense amplifiers in FIG. 9 all belong to the same double word (logical word) and have the same double word index number. Thus, for the purpose of the mapping, we can consider that each group of eight sense amplifiers belongs to one Latin square column congruence class, as shown at the bottom of FIG. 9.

Since the central processing unit logical word, LW, is eight bytes total, or eight bits per chip, any cache block will consist of 256 bits on each of eight chips. A set of four cache blocks requires $4 \times 256 = 1024$ bits on each chip. Since this exactly equals the bits per word line on each chip, each row on eight corresponding chips stores the entire congruence class, or four complete blocks. Since any given block only requires 256 bits per chip and there are 256 sense amplifiers, a full block can be reloaded into the cache array on one cycle, from a reload buffer. If the sense amplifier pitch was one in eight, instead of one in four, giving only 128 sense amplifiers instead of 256, a full block unload or reload would require two cycles. (See, for example, Matick, R. E., et al, January 1989, discussed above.)

In order to be able to access the eight byte logical word for late select to the central processing unit, the Latin square indexing must be done, as a minimum, on the double word (eight byte) boundary as shown in FIG. 9. With this configuration, it is possible to provide all the required shifting, addressing, and late select decoding on the same chip in an efficient manner as described below.

Figure 10:
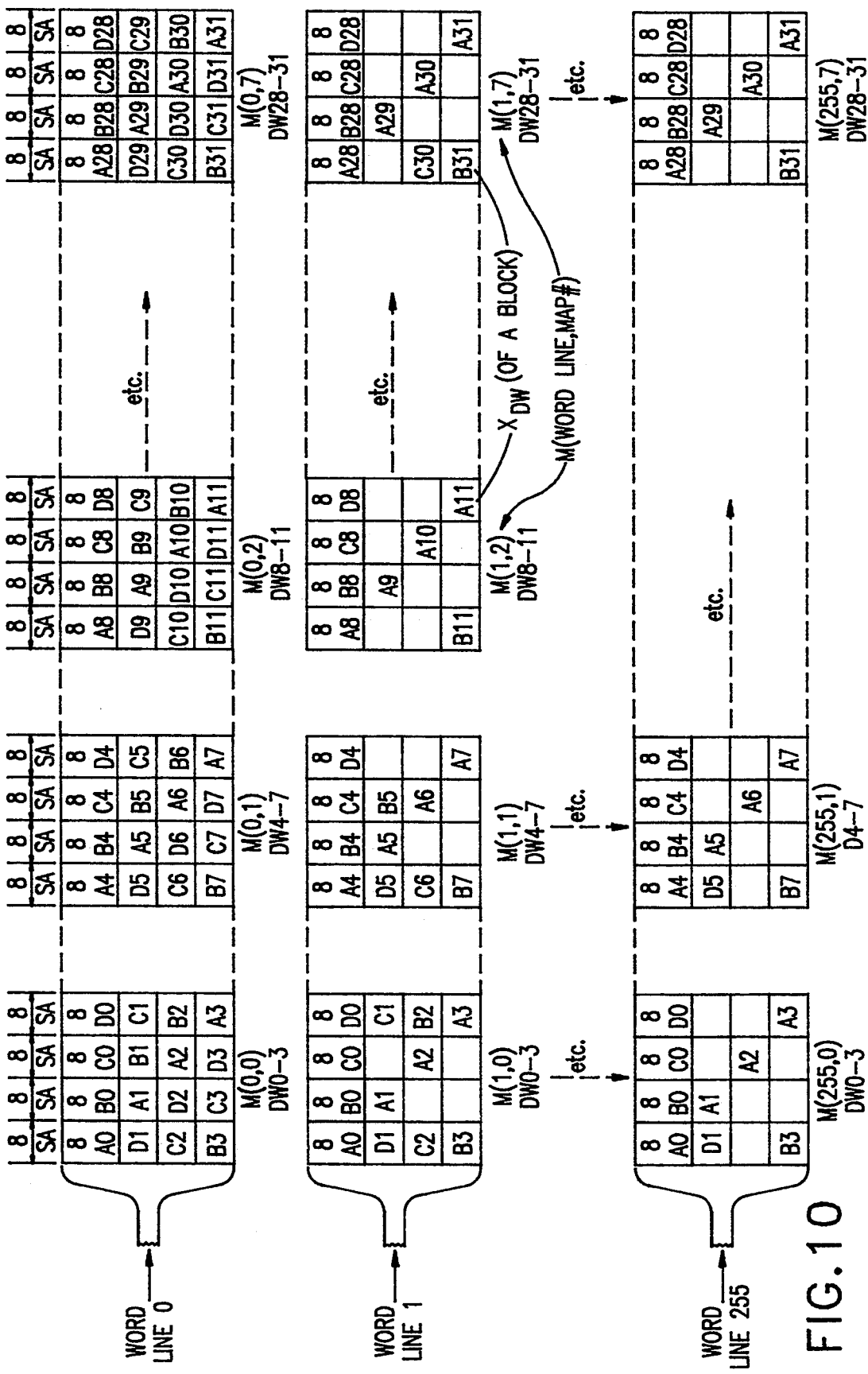
FIG. 10 schematically shows a condensed view of the Latin square mapped memory cell array of FIG. 9.

The full, individual bit mapping of FIG. 9 can be simplified in the manner shown therein to give the condensed Latin square mapping of FIG. 10 for each chip. Considering the eight chips as a unit, then each word line (row across eight chips) contains 32 double words (logical words) from each of four blocks. The first word line contains 32 double words (DW 0 through DW 31) from a set of four blocks A, B, C, and D. The second word line contains 32 double words (DW 0 through 31) from a different set of four blocks A, B, C, and D, the third word line contains 32 double words from a different set of four blocks, and so on.

Each Latin square map (across eight chips) shown in FIG. 10 contains four double words from each of the four blocks, or a total of sixteen double words, as shown. Thus, each word line has eight such Latin square maps: M(0,0) to M(0,7) on word line 0, M(1,0) to M(1,7) on word line 1, etc., where the notation is M(word line, map). We will use this mapping in subsequent discussions to show the various functions required and some possible methods of implementation.

The double words (logical words) assigned to each of the Latin square maps are shown in FIG. 10, and are as follows:

M(W,0): double words 0, 1, 2, and 3
M(W,1): double words 4, 5, 6, and 7
M(W,2): double words 8, 9, 10, and 11
M(W,3): double words 12, 13, 14, and 15
M(W,4): double words 16, 17, 18, and 19
M(W,5): double words 20, 21, 22, and 23
M(W,6): double words 24, 25, 26, and 27
M(W,7): double words 28, 29, 30, and 31

These assignments will be used to achieve the proper decoders for various cases below.

Figure 11:
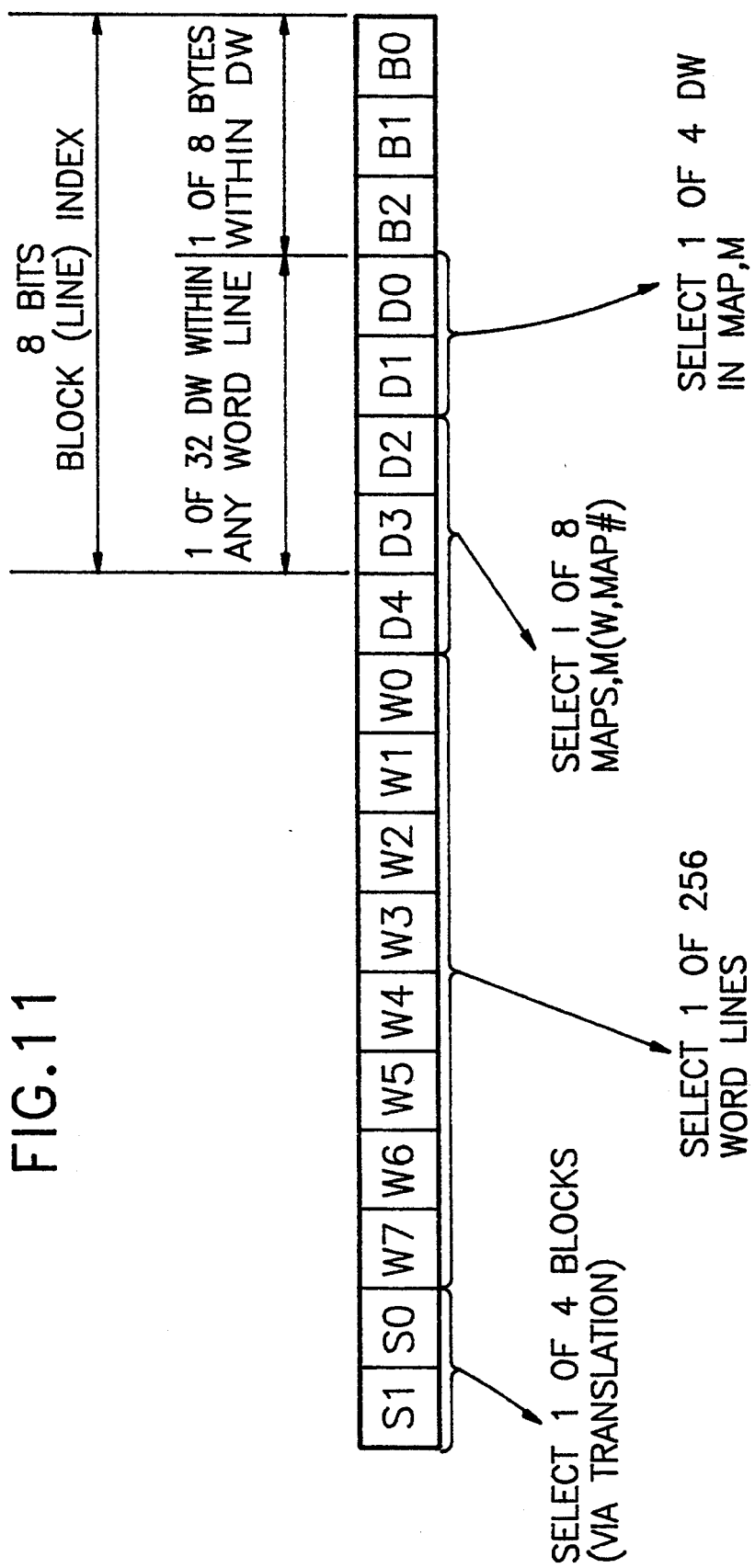
FIG. 11 schematically shows an example of an 18 bit address for an electronic computer memory.

For the mapping of FIG. 10, the eighteen bit address of the static random access memory cache is as shown in FIG. 11.

The word line bits, W0 to W7, select one of the 256 word lines, each containing 32 double words for each of four blocks. The bits D0 to D5 select one of the 32 double words from each of the four blocks. Bits D0 and D1 select one of four double word indices in each map, and bits D2 to D4 select one of eight possible Latin square maps. Bits S0 and S1 select one of the four blocks on each word line, and are provided by the cache controller, which specifies, for example, the block being read for a store-back, or being written for a reload. Bits B0 to B2 select one of the eight bytes within a double word.

As shown in FIG. 7, only one set of 256 sense amplifiers 84 is provided, and they are provided on the bottom of the memory cell array. The sense amplifiers 84 are shown as 32 groups of eight sense amplifiers per group. The sense amplifier groups are designated SAG0 through SAG31.

Figure 12A:
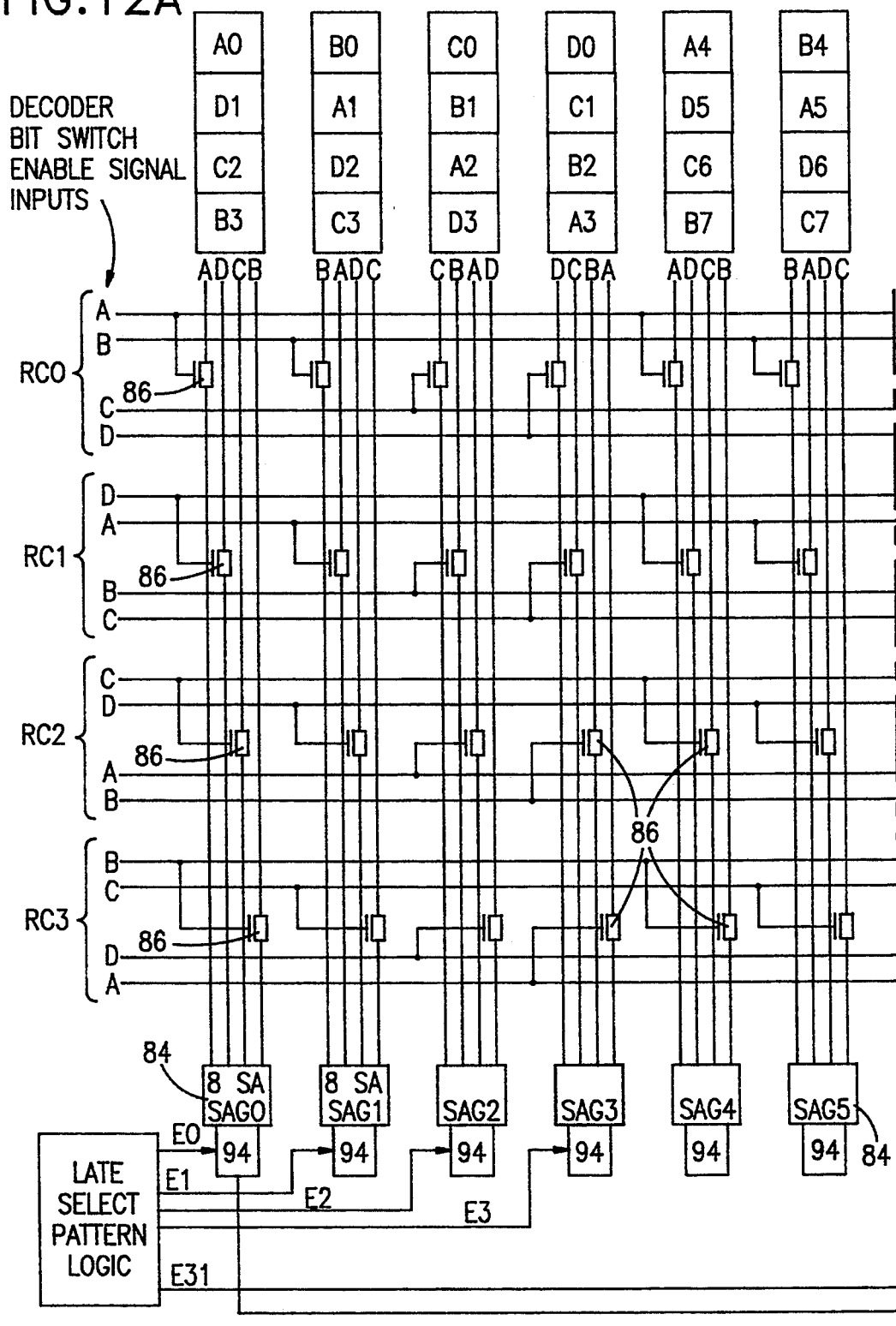
FIG. 12 schematically shows an example of a portion of a bit line switch array for an electronic computer memory.

For a normal read access, decoder 90 and bit switches 86 select 32 possible double words, eight from each of the four blocks. The remaining decoding of the correct double word and block is done by the late select pattern logic 92, to be described. The late select pattern logic 92 selects one of the double words by driving eight tristate drivers 98 on each chip, as shown in FIG. 12.

For a miss which requires a store back of one of the cache blocks, decoder 90 and bits switches 86 select all 32 double words from the block which now must be specified before the decoding can be completed. The block is usually known from the previous cycle in which the miss occurred. These 32 double words (256 bits per chip) are gated up through the shifter/aligner 96 located in the upper portion of FIG. 7, and into the store back buffer 98.

To be able to perform the two functions of selecting 32 double words, eight from each of four blocks, or all 32 double words from one block, decoder 90 must have a separate input to each bit switch 86 of each map. There are sixteen bit switches 86 per map so sixteen enable signals are required as shown in FIG. 12. All eight of the interleaved Latin square maps are connected in parallel as shown therein. Each bit switch 86 shown in FIG. 12 is a group of eight bit switches connected in parallel (see FIG. 9). However, only sixteen enable signals are needed since each group of eight parallel bit switches is activated with a single enable signal.

Figure 13:
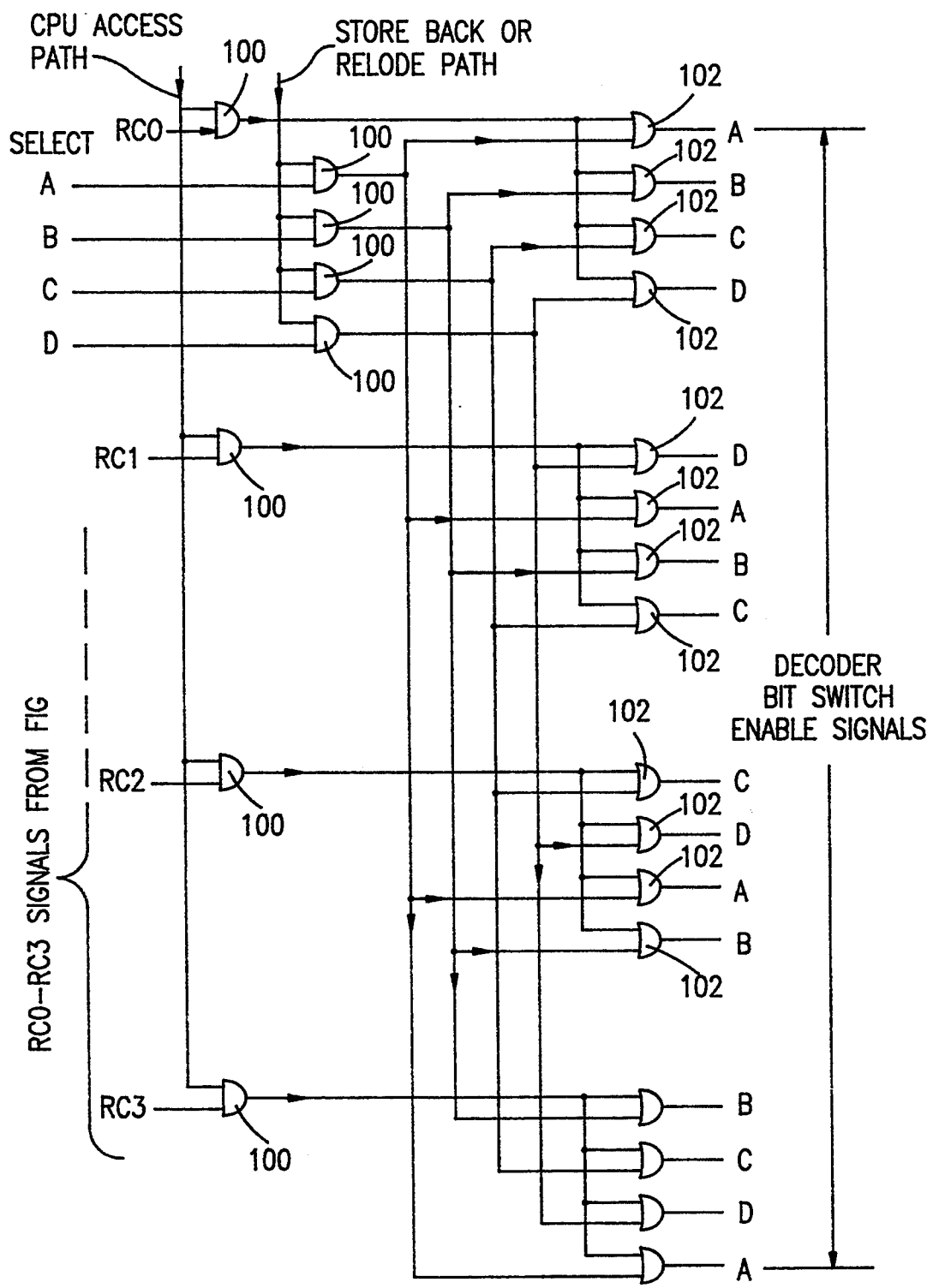
FIG. 13 schematically shows an example of a portion of an address decoder for an electronic computer memory.

FIG. 13 schematically shows a portion of the decoder 90 for generating the sixteen enable signals for activating the bit switches 86. Decoder 90 comprises AND gates 100 and OR gates 102, as shown. For the central processing unit path, decoder 90 selects 32 double words total, eight double words from each of the blocks. Decoder 90 does this by selecting only one of four row congruence classes RC0 through RC3 for each of the eight Latin square maps in a word line. Decoder 90 does not require the identity of the block, so this decoding and bit switch selection can be done in parallel with the array accessing and address translation. In other words, the Latin square mapping does not introduce any additional delay into this part of the path.

Figure 14:
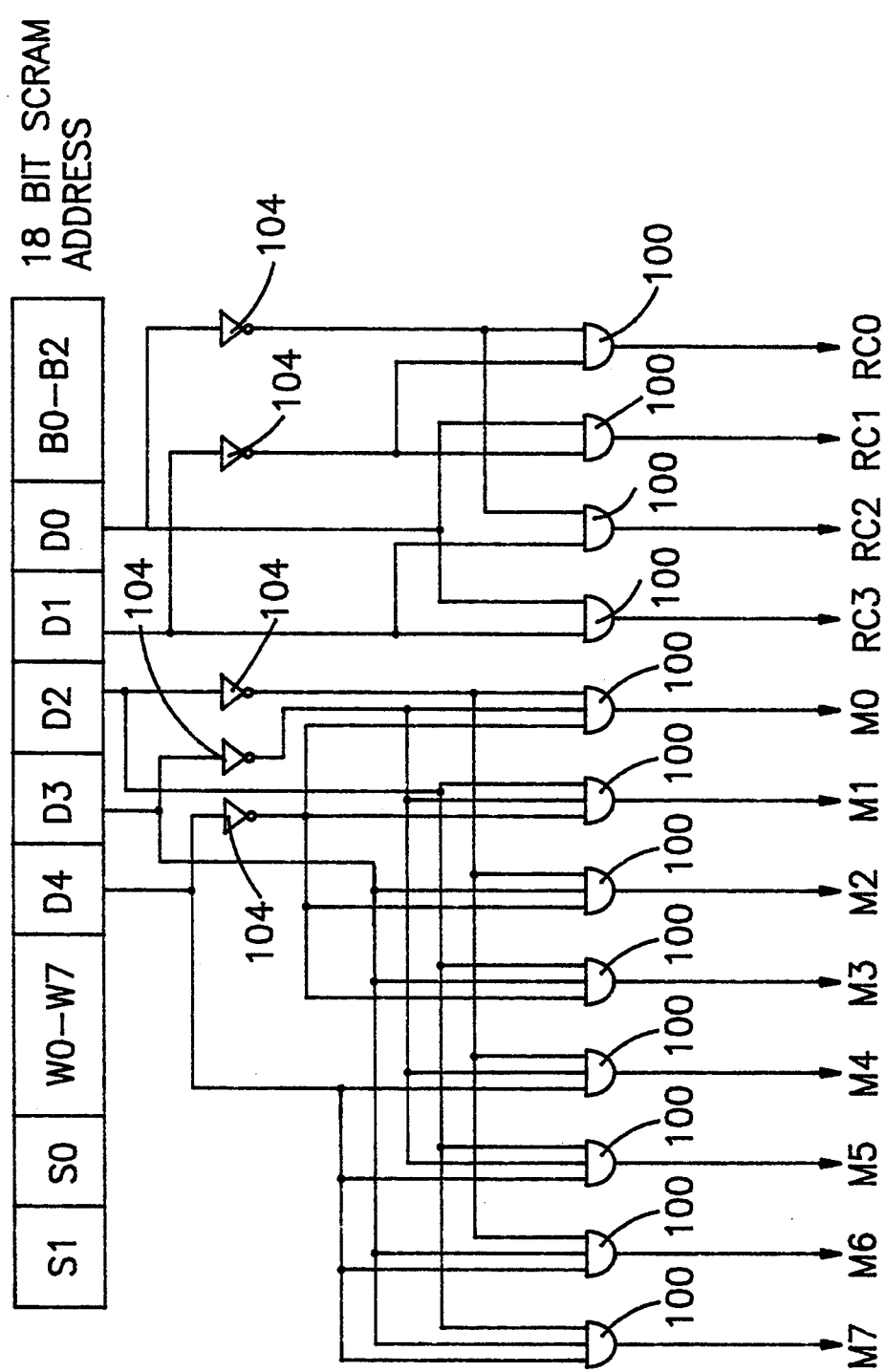
FIG. 14 schematically shows an example of another portion of an address decoder for an electronic computer memory.

FIG. 14 schematically shows another portion of the decoder 90 which also forms part of the late select pattern logic 92. By way of AND gates 100, and inverters 104, address bits D0 and D1 generate a signal for the appropriate one of four row congruence classes RC0, RC1, RC2, or RC3.

After the bits have been sensed by sense amplifiers 84, the late select pattern logic 92 must select one of eight double words from the desired block. But since the data is Latin square aligned, it must be unscrambled. The late select pattern logic 92 unscrambles the Latin square alignment and decodes the one out of 32 intersections of the four row congruence classes, RC0 through RC3, with the eight possible maps, M, of FIG. 10. This decoding is done for the four blocks A, B, C, and D as detailed in FIG. 15. The late select pattern logic 92 comprises AND gates 100 and OR gates 102. The late select pattern logic 92 receives row congruence class signals and map number signals from the logic shown in FIG. 14, and receives a late block select signal from the cache controller. From these input signals, the late select pattern logic 92 generates one of the enable signals E0 through E31. The resulting enable signal selects one of 32 groups of eight sense amplifiers per group on each chip as shown in FIG. 12. This provides a double word (across eight chips) to the central processing unit, but requires no further alignment since the bits are always aligned within any double word.

Figures 15, 15A:
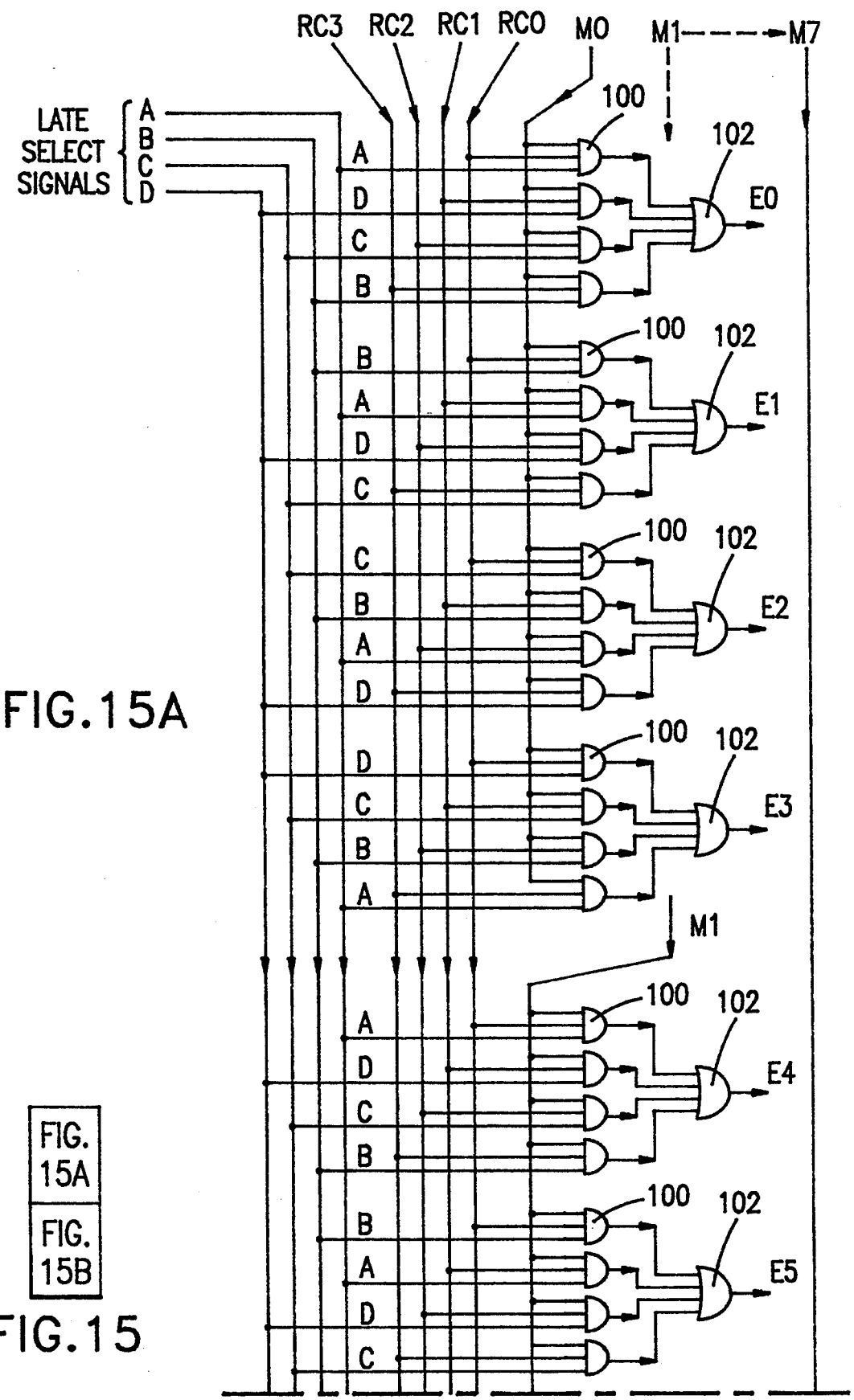
FIG. 15 schematically shows an example of a portion of a late select address decoder for an electronic computer memory.
Figure 15B:
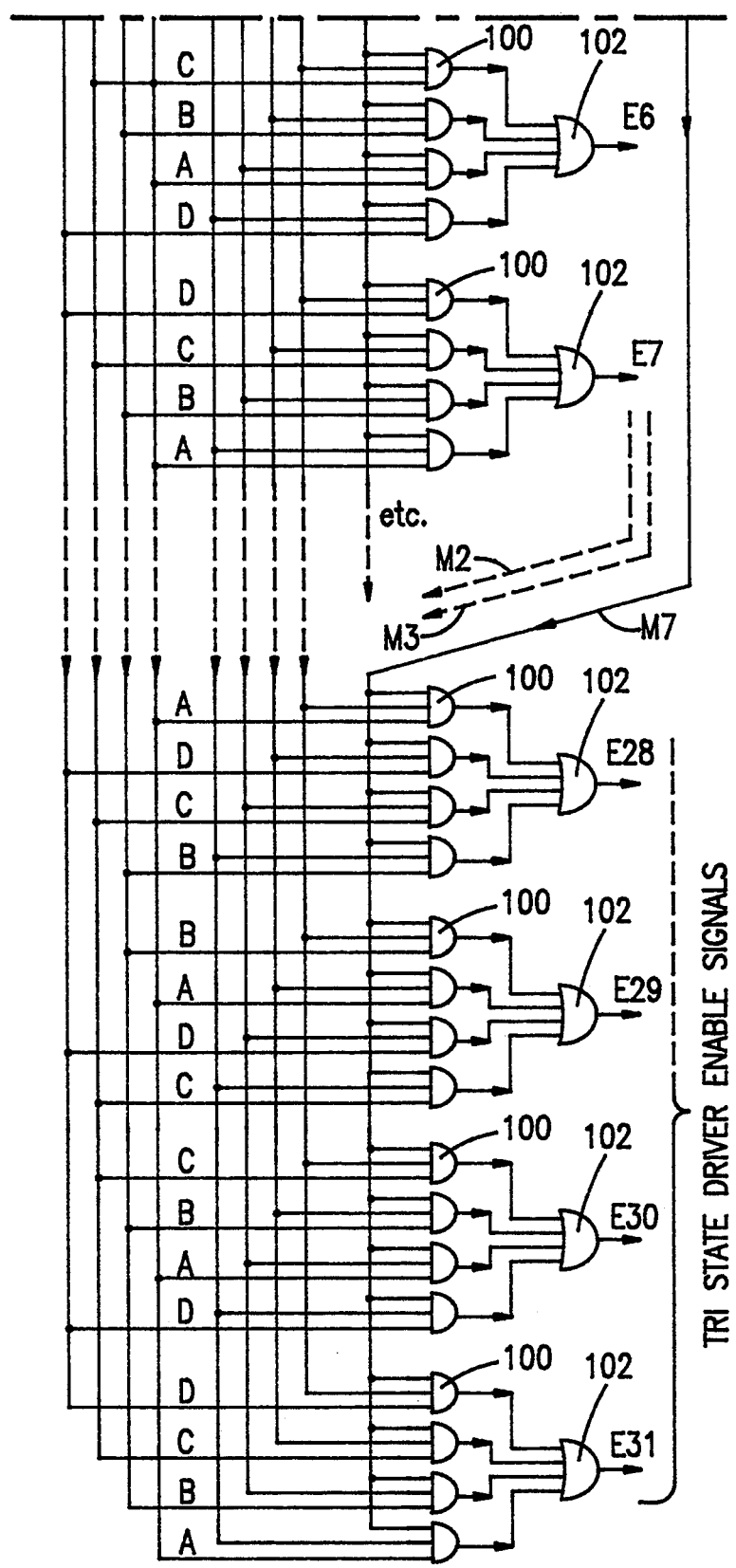

As can be seen from FIG. 15, the initial part of this decoding for selecting the correct double word can start immediately. The extra delay introduced by the Latin square mapping is basically one additional AND gate before selecting the correct double word to drive to the central processing unit.

For storing back data from the cache to the second memory level, decoder 90 and bit switches 86 select 32 double words from a single block A, B, C, or D as shown in FIGS. 12 and 13. The 256 sense amplifiers on each of the eight chips is exactly enough to hold one complete block from any of the four blocks.

With the interleaved Latin square mapping, the data in the sense amplifiers will not necessarily be aligned from left to right. Furthermore, the particular resulting alignment will vary depending on which block is selected. Thus, after decoder 90 enables appropriate bit switches 86 to select all 32 double words from a block specified by the block select signal, and after the 32 double words are sensed in the 256 sense amplifiers, the data in the sense amplifiers must be shifted or aligned to the correct double word boundary.

Figure 16:
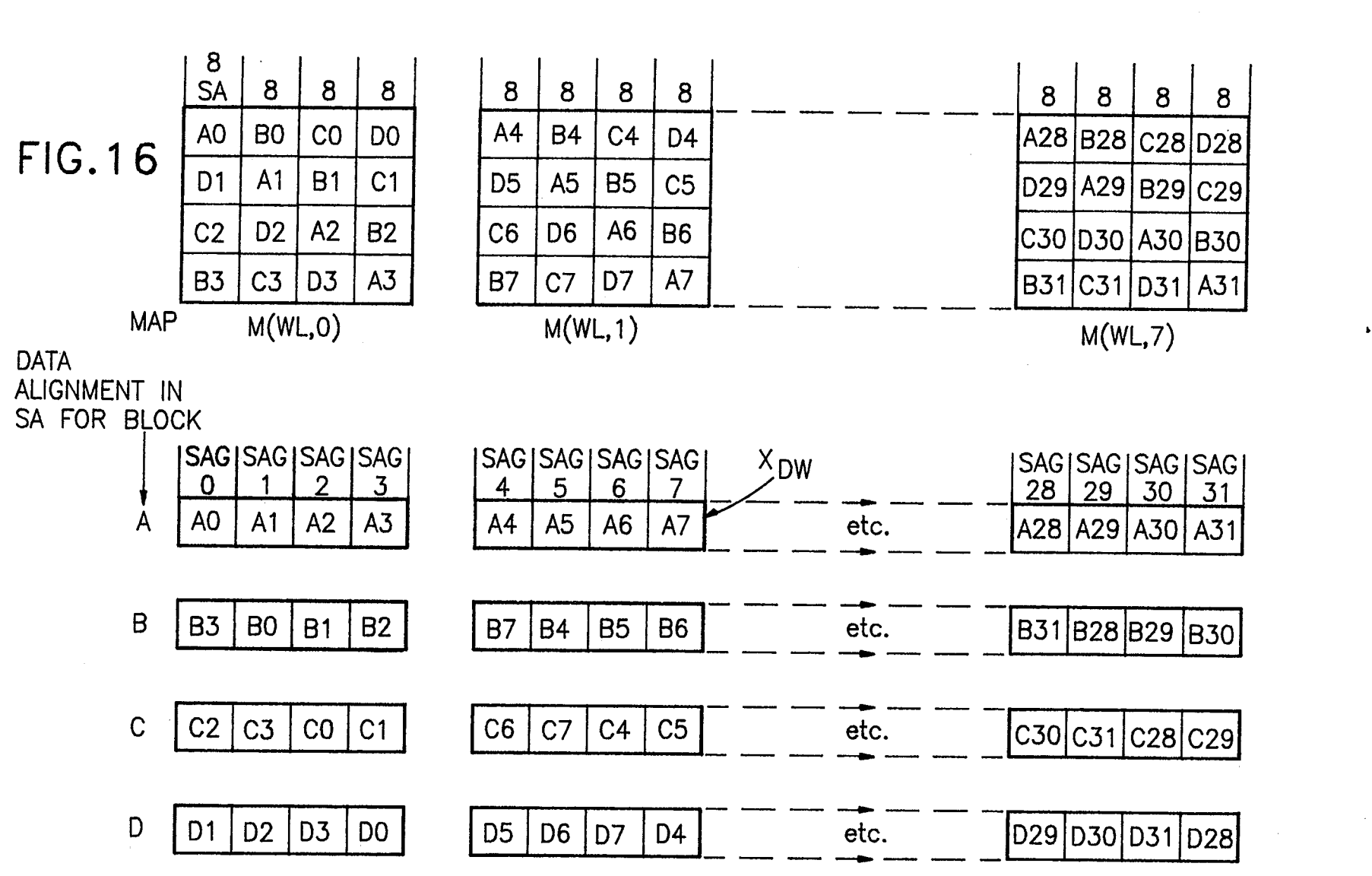
Figure 17:
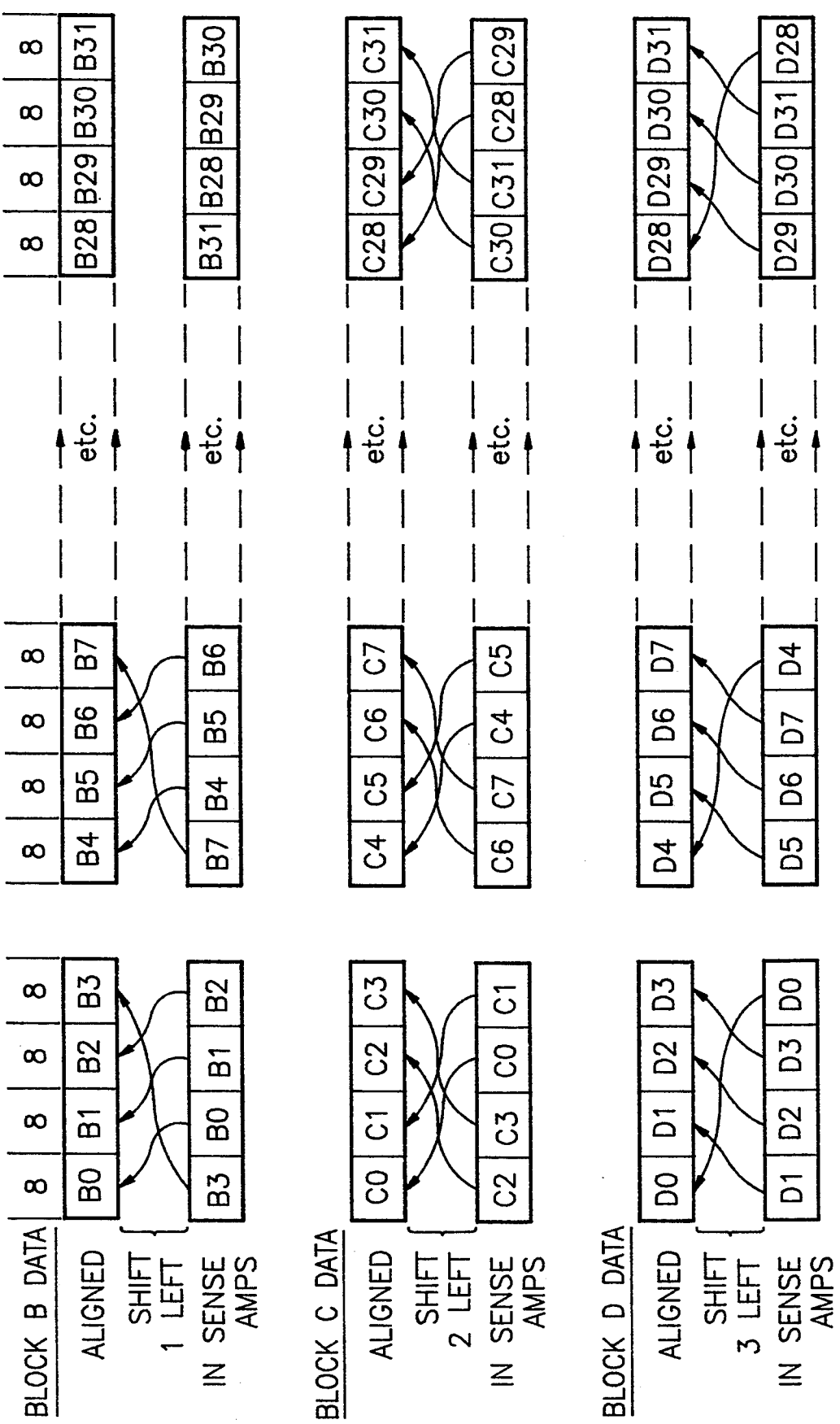
FIG. 17 schematically shows an example of data shifting required to realign data being read out of or being written into a Latin square mapped memory cell array.

When decoder 90 and bits switches 86 select a full block of double words, the data in the sense amplifiers will be aligned on boundaries specified by the interleaved Latin square mapping of FIG. 10. For each of the blocks selected by decoder 90, the alignment will be as shown in FIG. 16. Block A will be perfectly aligned and requires no shifting. Block B is aligned one sense amplifier group (SAG) of eight bits to the right, block C two sense amplifier groups to the right, and block D is three sense amplifier groups to the right. In order to achieve proper alignment, blocks B, C, and D will have to be shifted one, two, and three groups to the left, respectively, as shown in FIG. 17.

Because of the interleaved configuration of the Latin square mapping, the maximum shift distance on any data is three sense amplifier groups, or a real distance of $3 \times 8 = 24$ bit positions. If we did not use an interleaved mapping, but rather a straight Latin square map across the full 1024 bits of a row, then the shift distance would be $31 \times 8 = 248$ bit positions. This would increase the wiring length and delay, and would give a very complex wiring configuration, all bad for a high speed design. The interleaved mapping greatly simplifies and reduces the wiring paths.

The alignment of data is done on the output side of the sense amplifiers, after the data has been latched. The shifter/aligner 96 may, for example, comprise a simple network of bit switches 106 as shown in FIG. 18. The input enable signals are simply the usual block select signals from the cache controller. The data is always shifted by the amount specified for any given block. As stated previously, the shifting is done on a four double word boundary, and there are eight such identical patterns, one for each of the M maps in FIG. 10.

Returning to FIG. 7, for writing into the memory cell array 78 from either the central processing unit (CPU) or from the second memory level 110, it is assumed that the translation is completed before the write cycle starts. For writing into the memory cell array 78 from the central processing unit, eight write drivers 108 are connected into the top of the bit/sense lines. For writing into the memory cell array 78 from the second memory level 110, 256 write drivers in the cache reload buffer 112 are connected into the top of the bit/sense lines 82 by way of the shifter/aligner 96 and a group of reload enable switches 114. An inverse of the path out of the chip on the bottom must be duplicated on the top. This requires a decoder 116 and bit switches 118 which duplicate decoder 90 and bits switches 86, and a late select pattern logic 120, which duplicates late select pattern logic 92, along with associated selection switches 122 for connecting write drivers 108 to bit/sense lines 82.

The interface between the static random access memory of the first memory level, and the dynamic random access memories of the second and third memory levels requires certain functions to be performed. The exact manner and location of these functions can vary somewhat. First, with the interleaved Latin square mapping, the data into and out of the static random access memory must be shifted/aligned. Second, the interface from the static random access memory of the first memory level to the dynamic random access memory of the second memory level is 256 bits per cycle, while the interface between the first and third memory levels is 32 bits per cycle. However, the static random access memory store-back and reload paths are buffered by the store back buffer 98 and the reload buffer 112 shown in FIG. 7.

The shifter/aligner 96 may be located between the static random access memory array and the store back and reload buffers, as shown in FIG. 7, and works in a bidirectional mode, shifting both out-going and in-coming data.

Figure 19B:
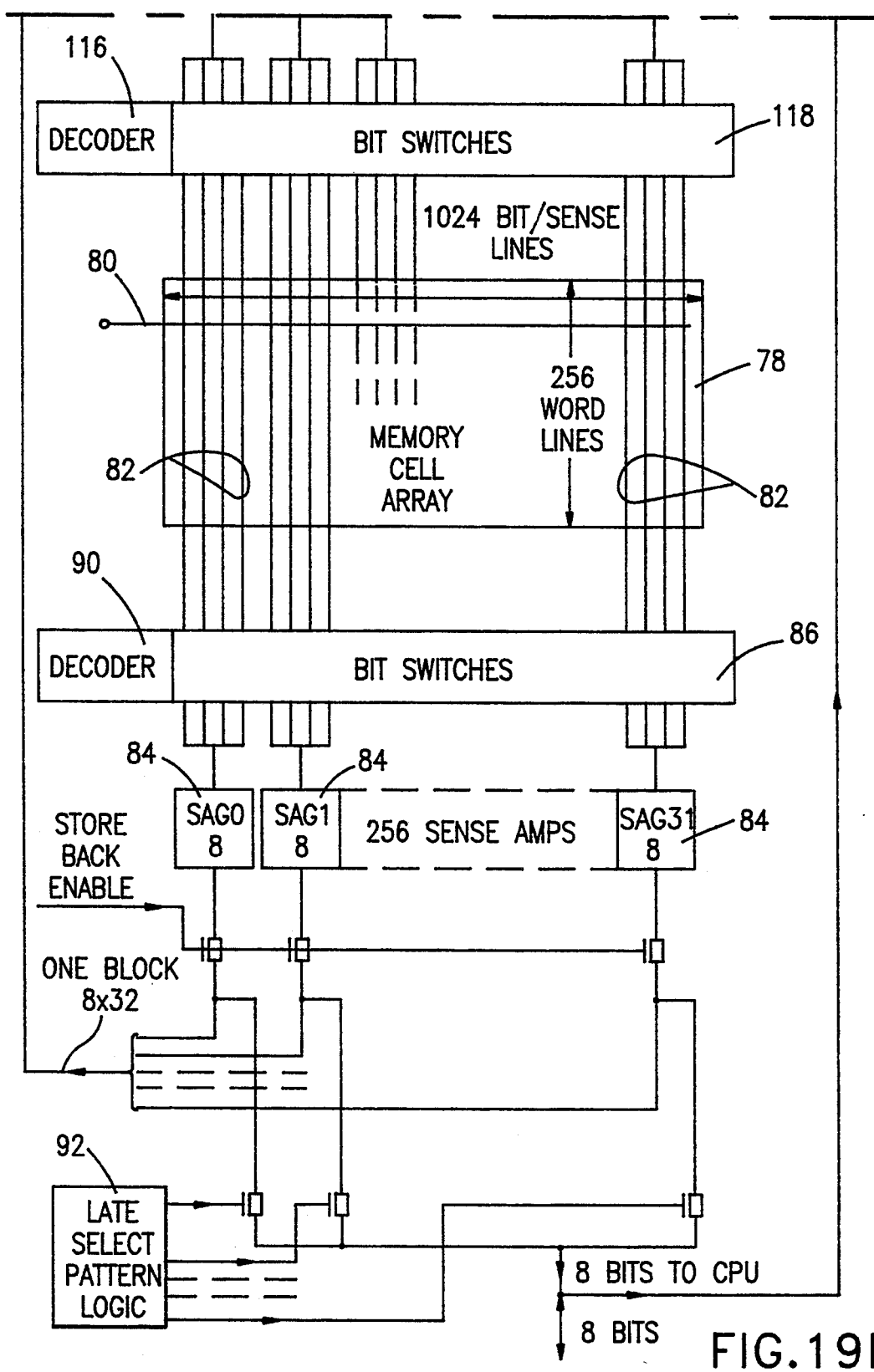
FIG. 19 is a block diagram of an example of another alternative electronic computer memory according to the invention.

An alternative location for the shifter/aligner 96 could be between both the second and third memory levels L2/L3 and both the store back buffer 98 and the cache reload buffer 112, as shown in FIG. 19. Once again the shifter/aligner 96 works in a bidirectional mode. Sometimes only 32 bits pass through the shifter/aligner 96, and other times 256 bits depending on the operation. The shifter/aligner 96 is just a set of passive switches so it does not matter how many are active. For data passing to or from the second memory level 110 and directed from or to the store back buffer 98 or the cache reload buffer 112, a multiplexor 124, 126, or 128 will select the 256 bit path.

For data to or from the third memory level L3 and directed from or to the store back buffer 98 or the cache reload buffer 112, the multiplexor 124, 126, or 128 selects 32 of the 256 lines, the remaining lines being in a high impedance state. For this case, a full block transfer requires eight cycles, and the multiplexor 124, 126, or 128 will have controls to increment the address and selection of the successive groups of 32 bits. (See, for example, Matick, R. E., et al. "Architecture, design, and operating characteristics of a 12-ns CMOS functional cache chip." *IBM Journal of Research and Development*, Vol. 33, No. 5, September 1989, pages 524–539.)

If the circuit design, layout, and/or speed requirements dictate a unidirectional shifter, this could be achieved by essentially duplicating the shifter/multiplexer pair 96/128 in FIG. 19 and using one pair as input to the cache reload buffer 112 and the other as an output from the store back buffer 98. There are many options, some of which will be dictated by the technology and overall specifications. However, the fundamental concept does not change.

In terms of the overall system operation, the ideal input/output interface on the dynamic random access memory of the second memory level 110 would be the selectable 32/256 bit path shown in FIG. 7. The transfer path between the dynamic random access memory of the second memory level 110 and the static random access memory (the store back buffer 98 and the cache reload buffer 112) will be 256 bits, and the transfer path between the first and third memory levels (the store back buffer/cache reload buffer) will be 32 bits, regardless of other paths. For a reload of a missed block from the third memory level L3 to the first and second memory levels, the first 32 bytes contain the double word which caused the miss. The first group of 32 bytes are gated into the cache reload buffer 112 and the load-thru path in enabled. The double word currently being accessed is decoded by the load-thru decoder 130 and passes to the central processing unit. Optionally, the same function can be performed on subsequent cycles, if desired.

The main issue at hand now is transferring the eight cycles of 32 bits per cycle into the dynamic random access memory of the second memory level 110. If the second memory level 110 has a 32 bit input path with appropriate decoding, selection, and an input buffer register (IBR) 132, (similar to the cache reload buffer 112) then the 32 bits can go both to the cache reload buffer 112 and to the input buffer register 132 on each cycle. At the end of the eight cycles, the input buffer register 132 can be loaded into the dynamic random access memory.

If the second memory level only has a 256 bit input capability, then the second memory level 110 can be reloaded as follows. After the cache reload buffer 112 is full, the data can be copied to the store back buffer 98 in one machine cycle, and then from there loaded as 256 bits into the second memory level 110. If the second memory level 110 has an input buffer register 132 with a 256 bit input path for aligned bits, then one additional cycle is required for the store back buffer 98 to load the input buffer register 132, and about eight cycles for the input buffer register 132 to be written into the dynamic random access memory. However, the store back buffer 98 is freed after loading the input buffer register 132.

With the cache structure shown in FIGS. 7 and 19, when a block of data is reloaded from the second memory level 110 into the first memory level, the double word which caused the miss will be loaded through at the same time that the cache reload buffer is fully loaded. On the next cycle, if data is needed from the cache reload buffer 112, the entire cache reload buffer can be loaded to the static random access memory and the desired double word can be accessed at the same time.

For reloads to the static random access memory coming from the third memory level L3, the data in the cache reload buffer 112 could be accessed in the same manner, except the full block may not be present and a subsequent load of the cache reload buffer 112 to the memory cell array 78 may still be required.

The manner in which the data in the cache reload buffer 112 is made accessible to the central processing unit is another design option. (See, for example, Matick, R. E., et al. "Architectural implications in the design of microprocessors." *IBM Systems Journal*, Vol. 23, No. 3, 1984, pages 264–280; Matick, R.E., et al, January 1989, cited above; and Radin, G. "The 801 minicomputer." *IBM Journal of Research and Development*, Vol. 27, No. 3, 1983, pages 237–246.)

The following is an example of a worst case cache reload. In this example, there is miss to both the first and the second memory levels, and both have a block to be stored back, i.e. the first memory level has a store-back to the second memory level, the second memory level has a store back to the third memory level, and the reloading block must go to both the first and the second memory levels. The steps to accomplish this would be as follows, for the configuration of FIG. 19.

Step 1: Cycle T1

Access the static random access memory and the dynamic random access memory directories; both give miss and castout identity, say, B3 out of the first memory level, B9 out of the second memory level, and block B6 to be reloaded from the third memory level.

Step 2: Cycle T2

Access the static random access memory for B3 and latch into store back buffer. Start the dynamic random access memory access for B9. Start the third memory level access for B6.

Step 3: Cycle T3

Transfer B3 from the store back buffer to the input buffer register (one cycle).

Step 4: Cycle T2+TD (TD=dynamic random access memory access time in machine cycles)
Block B9 into the output buffer register.

Step 5a: Cycle T2+TD+1

Start a write cycle of the input buffer register (containing B3) into the dynamic random access memory. Transfer B9 from the output buffer register to the cache reload buffer (one cycle).

Step 5b: Cycle T2+TD+2

Transfer the cache reload buffer (B9) to the store back buffer (one cycle).

Step 6: Cycle T2+TD+1+TD

B3 is now in the dynamic random access memory (B9 waiting in the store back buffer).

Step 7: Cycle T2+TM {TM is the third memory level access time}

First 32 bytes of B6 (containing the double word which caused the miss) are transferred to the input buffer register and to the cache reload buffer, and the double word causing the miss is loaded thru to the central processing unit. The reload from the third memory level continues for seven additional cycles.

Step 8: Cycle T2+TM+7

Block b6 is fully reloaded into the input buffer register and to the cache reload buffer.

Step 9: Cycle T2+TM+8

Start the dynamic random access memory write cycle of B6 (in the input buffer register) into the array. Start the store back of the store back buffer to the third memory level. The complete store back to the third memory level will take TM+7 cycles Step 10: Cycle T2+TM+8+(TM+7)

Store back buffer (B9) fully stored back to the third memory level.

In the above process, it was implicitly assumed that $$TM \geq 2 \times TD + 1 \text{ cycles} \quad (9)$$

so that Step 6 would automatically occur before Step 7. If this is not the case, then the reload controller will have to provide the necessary controls so as to avoid a conflict between the loading of B3 and B6 into the input buffer register on the dynamic random access memory. Alternatively, the 32 bit data path from the third memory level could be loaded only into the cache reload buffer, and not directly into the second memory level. Subsequently, when the full block transfer from the third memory level is completed, the second memory level can be reloaded by way of the store back buffer path.

We claim:

1. An electronic computer memory comprising:
   an array of memory cells, each memory cell storing a data signal, each memory cell having at least one word line input and at least one bit line output;
   at least one word line connected to the word line inputs of at least first, second, third, and fourth memory cells;
   a first sense amplifier for reading data from memory cells;
   a second sense amplifier for reading data from memory cells;

a first switch for switchably connecting the bit line output of the first memory cell to the first sense amplifier, said first switch having a control input;

a second switch for switchably connecting the bit line output of the second memory cell to the first sense amplifier, said second switch having a control input;

a third switch for switchably connecting the bit line output of the third memory cell to the second sense amplifier, said third switch having a control input;

a fourth switch for switchably connecting the bit line output of the fourth memory cell to the second sense amplifier, said fourth switch having a control input;

address decoding means for independently actuating either the first and third switches without actuating any other switches connecting memory cell bit line outputs to the first and second sense amplifiers, or the first and fourth switches without actuating any other switches connecting memory cell bit line outputs to the first and second sense amplifiers;

characterized in that the control inputs of each of the first, second, third, and fourth switches are capable of being actuated independently of all other switches connecting memory cell bit line outputs to the first and second sense amplifiers.

2. The electronic computer memory according to claim 1, characterized in that each memory cell has two bit line outputs.

3. An electronic computer memory comprising:

an array of memory cells, each memory cell storing a data signal, each memory cell having at least one word line input and at least one bit line input;

at least one word line connected to the word line inputs of at least first, second, third, and fourth memory cells;

a first write driver for writing data to memory cells;

a second write driver for writing data to memory cells;

a first switch for switchably connecting the bit line input of the first memory cell to the first write driver, said first switch having a control input;

a second switch for switchably connecting the bit line input of the second memory cell to the first write driver, said second switch having a control input;

a third switch for switchably connecting the bit line input of the third memory cell to the second write driver, said third switch having a control input; and a fourth switch for switchably connecting the bit line input of the fourth memory cell to the second write driver, said fourth switch having a control input;

address decoding means for independently actuating either the first and third switches without actuating any other switches connecting memory cell bit line inputs to the first and second write drivers, or the first and fourth switches without actuating any other switches connecting memory cell bit line inputs to the first and second write drivers;

characterized in that the control inputs of each of the first, second, third, and fourth switches are capable of being actuated independently of all other switches connecting memory cell bit line inputs to the first and second write drivers.

4. The electronic computer memory according to claim 3, characterized in that each memory cell has two bit line inputs.

5. An electronic computer memory comprising:

a cache memory comprising a plurality of rows of memory cells, each row of memory cells comprising at least first and second blocks of memory cells, each memory cell storing a data signal, each memory cell having at least one word line input and at least one bit line output;

a word line connected to the word line inputs of at least first, second, third, and fourth memory cells in a row of the cache memory, the first and third memory cells being contained in the first block, the second and fourth memory cells being contained in the second block;

a first sense amplifier for reading data from memory calls;

a second sense amplifier for reading data from memory calls;

a first switch for switchably connecting the bit line output of the first memory cell to the first sense amplifier, said first switch having a control input;

a second switch for switchably connecting the bit line output of the second memory cell to the first sense amplifier, said second switch having a control input;

a third switch for switchably connecting the bit line output of the third memory cell to the second sense amplifier, said third switch having a control input; and a fourth switch for switchably connecting the bit line output of the fourth memory cell to the second sense amplifier, said fourth switch having a control input;

selection means for independently actuating either the first and third switches to connect memory cells only in the first block to the sense amplifiers, or the first and fourth switches to connect memory cells in both the first and second blocks to the sense amplifiers;

characterized in that the control inputs of each of the first, second, third and fourth switches are capable of being actuated independently of all of other switches connecting memory cell bit line outputs to the first and second sense amplifiers.

6. An electronic computer memory as claimed in claim 5, characterized in that the selection means further independently actuates either the second and fourth switches to connect memory cells only in the second block to the sense amplifiers, or the second and third switches to connect memory cells in both the first and second blocks to the sense amplifiers.

7. An electronic computer memory as claimed in claim 5, characterized in that:

each row of memory cells comprises M blocks of memory cells;

each block of memory cells comprises N memory cells;

the computer memory comprises N sense amplifiers for reading data from memory cells;

the computer memory comprises M times N switches, each switch switchably connecting the bit line output of only one memory cell per row to one sense amplifier, each switch having a control input;

the control inputs of the switches are capable of being independently actuated; and the selection means independently actuate a first group of switches to connect N memory cells in a block to the sense amplifiers, or independently actuate a second group of switches to connect N divided by M memory cells in each of the M blocks to the sense amplifiers.

* * * * *